US008530759B2

(12) United States Patent
Hagiwara et al.

(10) Patent No.: US 8,530,759 B2

(45) Date of Patent: Sep. 10, 2013

(54) ELECTRONIC APPARATUS

(75) Inventors: Katsumasa Hagiwara, Isesaki (JP); Masao Fujimoto, Isesaki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 74 days.

(21) Appl. No.: 13/045,606

(22) Filed: Mar. 11, 2011

(65) Prior Publication Data

US 2011/0226524 A1 Sep. 22, 2011

(30) Foreign Application Priority Data

Mar. 16, 2010 (JP) ................................ 2010-059502

Mar. 16, 2010 (JP) ................................ 2010-059513

(51) Int. Cl.
*H01R 13/46* (2006.01)

(52) U.S. Cl.
USPC ........ 174/520; 174/50; 174/535; 439/620.13; 361/748

(58) Field of Classification Search
USPC ........... 174/520, 50, 535; 361/748; 318/293; 439/620.01, 620.1, 620.13
See application file for complete search history.

(56) References Cited

U.S. PATENT DOCUMENTS

| | | | | |
|---|---|---|---|---|
| 4,846,732 | A * | 7/1989 | Meelhuysen | 439/620.1 |
| 6,548,972 | B2 * | 4/2003 | Takagi | 318/293 |
| 6,906,483 | B2 * | 6/2005 | Tominaga et al. | 318/293 |
| 7,488,184 | B2 * | 2/2009 | Yasuda et al. | 439/76.1 |
| 7,621,367 | B2 * | 11/2009 | Tominaga et al. | 180/444 |
| 2005/0167183 | A1 * | 8/2005 | Tominaga et al. | 180/444 |
| 2009/0215293 | A1 * | 8/2009 | Hori et al. | 439/84 |

FOREIGN PATENT DOCUMENTS

JP 9-35820 2/1997

* cited by examiner

*Primary Examiner* — Angel R Estrada

*Assistant Examiner* — Dimary Lopez

(74) *Attorney, Agent, or Firm* — Antonelli, Terry, Stout & Kraus, LLP.

(57) ABSTRACT

An electronic apparatus includes a case; a circuit board mounted in the case; and a connector. The connector includes at least two connection terminals electrically connected with the circuit board, and a base portion attached to the case. The base portion holds the at least two connection terminals. An electronic component is attached to the at least two connection terminals to electrically connect the at least two connection terminals with each other through the electronic component.

7 Claims, 25 Drawing Sheets

10 20 10a 10b 71(70) 71c 71e 71d 90 50 40 51 24a 61(60) 62 72(70) 80 64 63(60) 50a

ELECTRONIC APPARATUS

BACKGROUND OF THE INVENTION

The present invention relates to an electronic apparatus.

Japanese Patent Application Publication No. 9-035820 discloses a previously proposed electronic apparatus. In this technique, an electronic component is stored on a base side of a connector portion which is connected with a terminal port of the electronic apparatus.

In this patent application, a circuit board on which the electronic component has been mounted is stored on the base side of the connector portion.

SUMMARY OF THE INVENTION

However, in the technique of the above patent application, the connector portion needs to be formed with a space for mounting the circuit board on which the electric component has been mounted. Hence, it is difficult to downsize the connector portion. That is, there is a problem that the electronic apparatus according to the technique of the above patent application is difficult to downsize further.

It is therefore an object of the present invention to provide an electronic apparatus devised to be further downsized.

According to one aspect of the present invention, there is provided an electronic apparatus comprising: a case; a circuit board mounted in the case; and a connector, wherein the connector includes at least two connection terminals electrically connected with the circuit board, wherein an electronic component is attached to the at least two connection terminals to electrically connect the at least two connection terminals with each other through the electronic component, and a base portion attached to the case, the base portion holding the at least two connection terminals.

The other objects and features of this invention will become understood from the following description with reference to the accompanying drawings.

DETAILED DESCRIPTION OF THE INVENTION

Hereinafter, embodiments according to the present invention will be explained in detail with reference to the drawings. In the following embodiments, a control unit of an electric power steering system will be described as one example of electronic apparatus. Any one of the following multiple embodiments includes structural elements similar to the corresponding structural elements of another of the following multiple embodiments. Hence, common reference signs will be given to these similar structural elements, and thereby, repeated explanations about these similar structural elements will be omitted for the purpose of simplification of the disclosure.

First Embodiment

Figure 1:
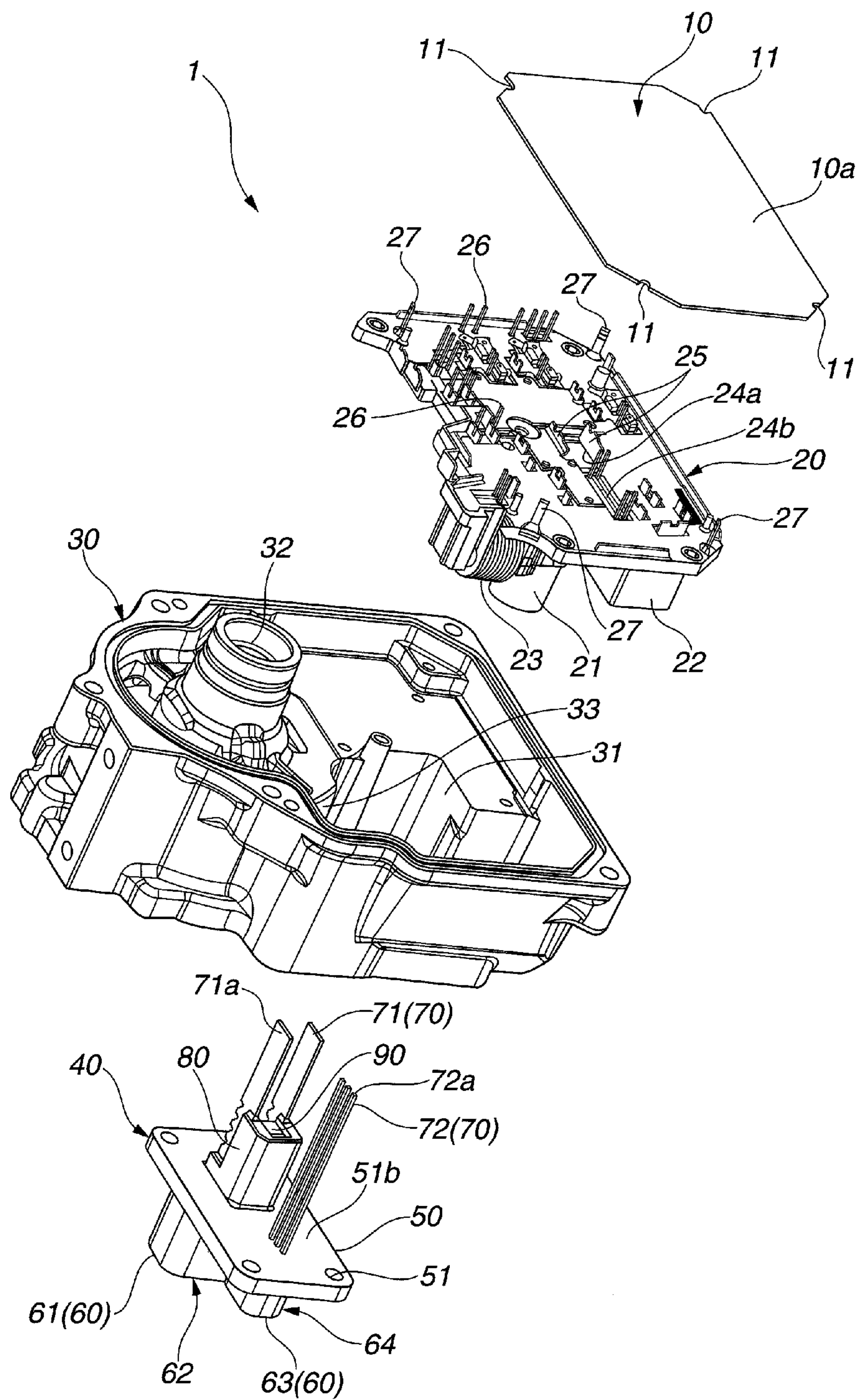
FIG. 1 is an exploded oblique perspective view showing a control unit of an electric power steering system according to a first embodiment of the present invention.

As shown in FIG. 1, a control unit (electronic apparatus) 1 of an electric power steering system in a first embodiment according to the present invention includes a case 30 functioning as a housing. The case 30 is formed of a metallic material (e.g., aluminium alloy) having a relatively high thermal conductivity. For example, this case 30 is formed by means of casting (such as die casting).

The case 30 is formed with a motor receiving portion 32 and a component-receiving portion 31. The motor receiving portion 32 serves to receive or enclose a motor (not shown), and is formed in an approximately cylindrical shape. The component-receiving portion 31 is formed adjacent to the motor receiving portion 32 to extend in parallel with the motor receiving portion 32. That is, the case 30 includes a dividing wall (partition) 33 which is sandwiched between the motor receiving portion 32 and the component-receiving portion 31.

The component-receiving portion 31 receives or encloses a printed circuit board 10 and a busbar board 20. Both of the printed circuit board 10 and the busbar board 20 are fixed to the case 30 by use of fastening components such as screws (not shown). Moreover, the busbar board 20 and the printed circuit board 10 are stacked in this order, from a bottom side (from left lower side in FIG. 1) of the component-receiving portion 31. The busbar board 20 and the printed circuit board 10 are disposed to keep an appropriate space (air void) between the busbar board 20 and the printed circuit board 10. In an example shown by FIG. 1 according to this embodiment, the busbar board 20 includes engagement protrusions 27, and the printed circuit board 10 includes engagement concave portions 11. By engaging the engagement protrusions 27 with the engagement concave portions 11, the busbar board 20 and the printed circuit board 10 are arranged to keep the appropriate space therebetween. However, according to this embodiment, the appropriate space between the busbar board 20 and the printed circuit board 10 may be secured by appropriately setting fixing locations of the busbar board 20 and the printed circuit board 10 relative to the case 30. Alternatively, the appropriate space may be secured by providing a spacer or the like between the busbar board 20 and the printed circuit board 10. It is noted that each of the busbar board 20 and the printed circuit board 10 corresponds to a circuit board according to the present invention.

The printed circuit board 10 includes a base 10*a* formed of, e.g., an insulating resin material such as a glass epoxy resin. In a surface (a surface facing the busbar board 20 in FIG. 1) 10*b* of the base 10*a*, a wiring circuit pattern (not shown) is formed.

Then, by mounting electronic components (not shown) such as a CPU by a soldering or the like to the wiring circuit pattern, a control circuit (not shown) is formed. It is noted that this electronic component such as a CPU corresponds to a first electronic component according to the present invention.

This control circuit carries out an arithmetic processing on the basis of external signals, internal signals and the like. Thereby, the control circuit controls switching elements (not shown) so that a characteristic of electric current to be supplied to the motor is varied. Thus, the control circuit controls a rotation speed and a torque of the motor.

Moreover, the busbar board 20 can be formed by disposing a plurality of busbars including busbars 25 and busbars 26 at predetermined locations of a mold (die), then by inputting an insulating synthetic resin (e.g., PBT (polybutylene terephthalate), PPS (polyphenylene sulfide) or PA (polyamide)) into the mold, and then by consolidating the inputted synthetic resin in a substantially plate shape, i.e., by means of insert molding. At this time, the busbar board 20 is formed with a plurality of through-holes including through-holes 24*a* and 24*b* each of which passes through the busbar board 20. A terminal portion of the busbar is exposed to a lateral surface of each of some through-holes. That is, the terminal portions of some of the busbars are respectively located on inner surfaces of some of the through-holes. Electrical connections can be secured by connecting the exposed portions of the busbars with terminals or the like of the motor and various components by welding, soldering or the like.

In this embodiment, a condenser 21, a relay 22, a coil 23, a switching element (not shown) and the like are mounted on the busbar board 20. These electronic components are accommodated in a concave portion defined by the component-receiving portion 31. It is noted that each of the condenser 21, the relay 22, the coil 23, the switching element and the like corresponds to the first electronic component according to the present invention.

Moreover, a drive circuit and a signal circuit are formed on the busbar board 20. The drive circuit functions to produce a driving current for the motor. The signal circuit is electrically connected with the electronic components such as the condenser 21 (the first electronic component), and functions to transmit control signals of these electronic components to the printed circuit board 10. That is, the busbar board 20 includes the drive circuit for producing the driving current of motor and the signal circuit for transmitting the control signals of electronic components to the printed circuit board 10.

In this embodiment, the busbars 25 and the like which pass a large current therethrough are not connected with the printed circuit board 10. On the other hand, the busbars 26 and the like (the other busbars among all the busbars provided in the busbar board 20) which do not pass a large current therethrough are connected with the printed circuit board 10.

Moreover, a connector 40 is provided at the component-receiving portion 31 of the case 30. The connector 40 electrically connects an inside of the control unit 1 of electric power steering system with an outside of the control unit 1.

Figure 2:
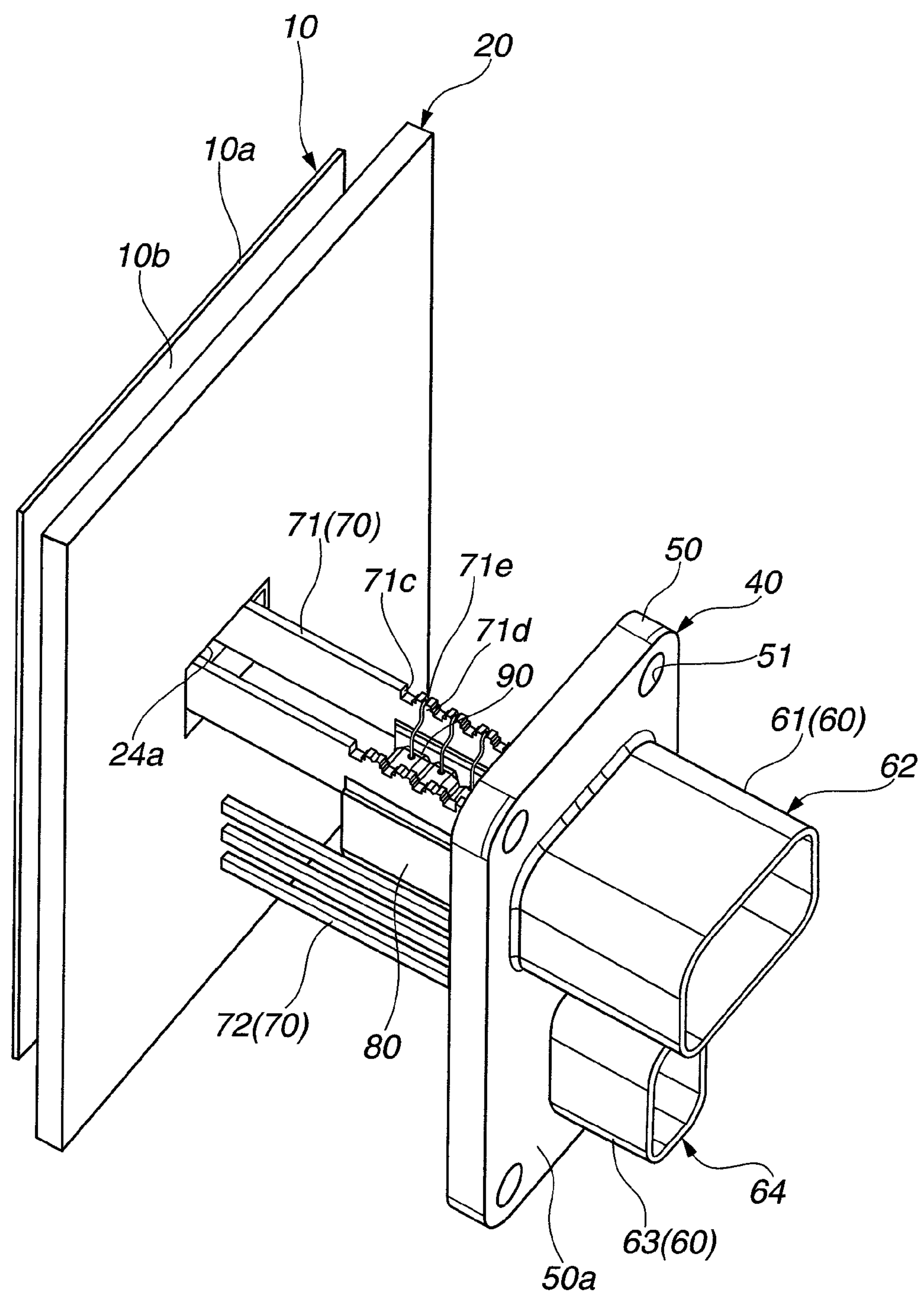
FIG. 2 is an oblique perspective view of a connector according to the first embodiment of the present invention.

As shown in FIGS. 1 and 2, the connector 40 includes a plurality of connection terminals 70 and a base portion 50. Each of the connection terminals 70 is electrically connected with the busbar board 20 or the printed circuit board 10. The base portion 50 holds the plurality of connection terminals 70 and is attached to the case 30.

In this embodiment, the plurality of connection terminals 70 includes a pair of power connection terminals 71 each formed in a substantially flat-plate shape, and three signal connection terminals 72 each formed in a rod shape. Each of the plurality of connection terminals 70 is provided integrally with the base portion 50 by means of insert molding. The pair of power connection terminals 71 are composed of a power-supplying connection terminal and a grounding connection terminal. It is noted that each of the pair of power connection terminals 71 corresponds to a plate-shape connection terminal according to the present invention.

The base portion 50 is formed in a substantially rectangular-parallelepiped shape. The base portion 50 includes four insertion holes 51 formed at four corner portions of the base portion 50. That is, the four insertion holes 51 are located at four corners of rectangular cross section of the base portion 50. By inserting fastening components such as screws (not shown) into these insertion holes 51, the base portion 50 is attached to the case 30.

Figure 5:
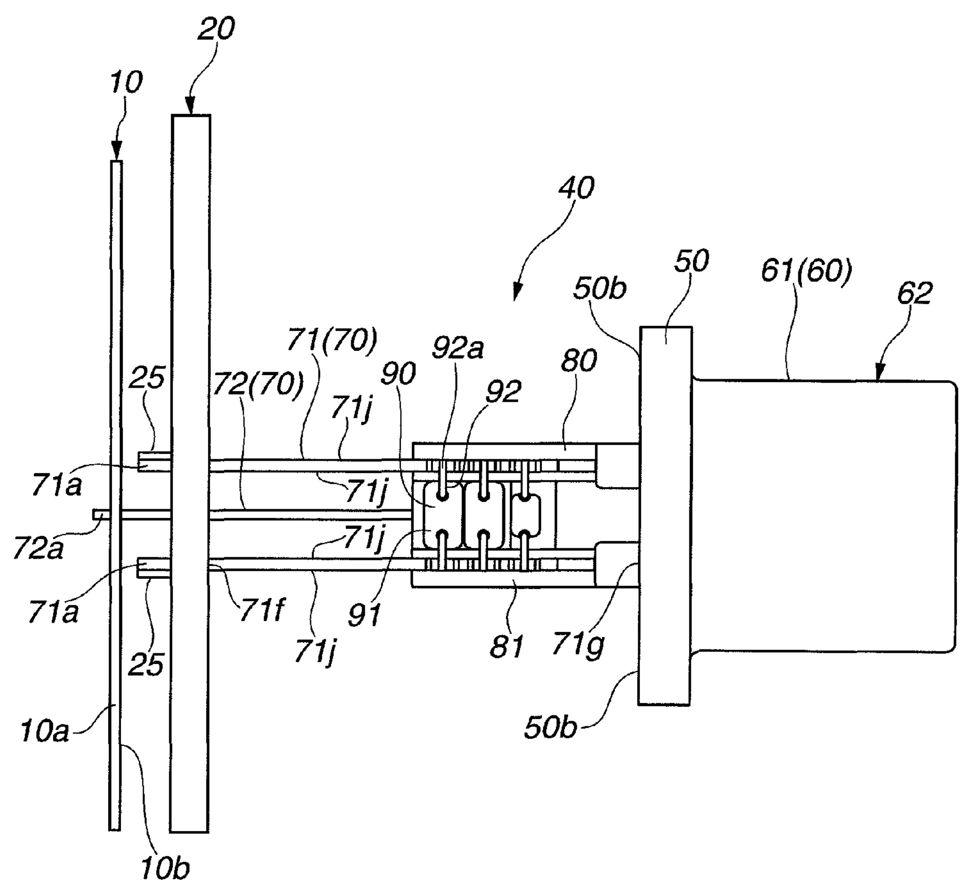
FIG. 5 is a top view of the connector according to the first embodiment of the present invention.
Figure 6:
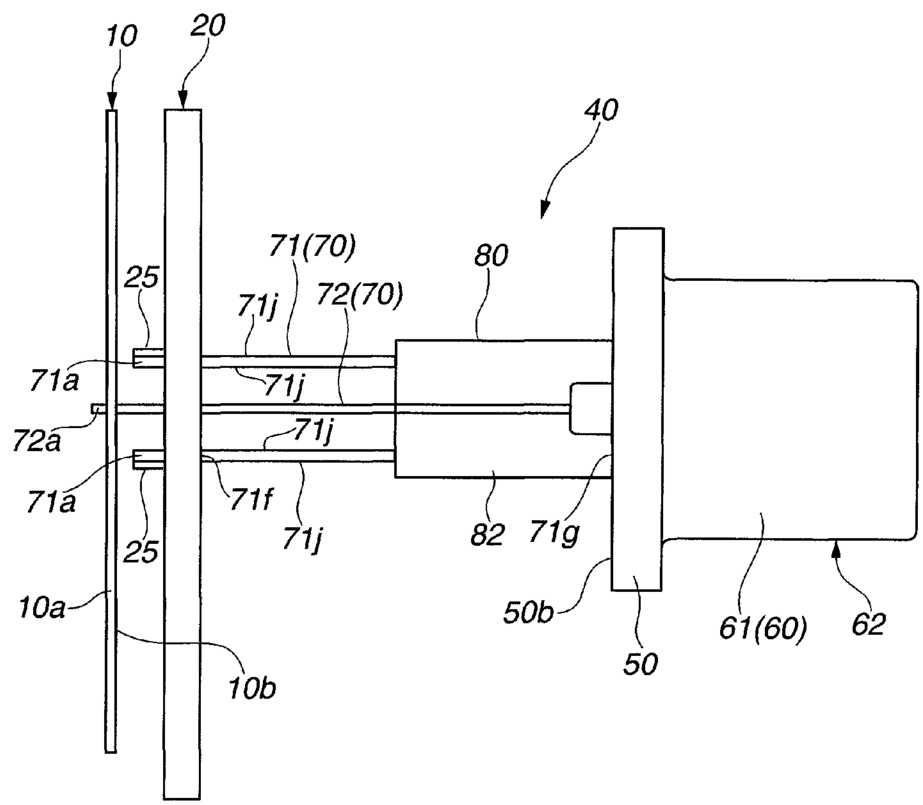
FIG. 6 is a bottom view of the connector according to the first embodiment of the present invention.

At this time, tip portions 71*a* of the pair of power connection terminals 71 which are located in one side (side of the printed circuit board 10) relative to an extension direction of the pair of power connection terminals 71 (i.e., an insertion direction of the connector 40 toward the case 30) is inserted into the through-hole 24*a* from a bottom side (left lower side in FIG. 1) of the component-receiving portion 31. The through-hole 24*a* is formed in a substantially square shape at a substantially center portion of the busbar board 20. The tip portions 71*a* are connected or joined to the busbars 25 exposed to both sides (both sides relative to a thickness direction of the power connection terminal 71) of the through-hole 24*a*. Thereby, the pair of power connection terminals 71 (plate-shaped connection terminals) are electrically connected with the busbar board (circuit board) 20, as shown in FIG. 5. In this embodiment, the joint between the tip portions 71*a* of power connection terminals 71 and the busbars 25 is performed by welding (e.g., TIG welding). The FIG. 2 and later drawings schematically depict the printed circuit board 10 and the busbar board 20.

When the base portion 50 is attached to the case 30, tip portions 72*a* of the signal connection terminals 72 which are located in one side (side of the printed circuit board 10) relative to an extension direction of the signal connection terminals 72 (i.e., the insertion direction of the connector 40 toward the case 30) are passed completely through the through-hole 24*b* formed in a slit shape in the busbar board 20. Thereby, the tip portions 72*a* are connected with the printed circuit board 10. Thus, by connecting the tip portions 72*a* of signal connection terminals 72 with the printed circuit board 10, the signal connection terminals 72 are electrically connected with the printed circuit board 10.

In this embodiment, since the long-and-thin power connection terminals 71 and the long-and-thin signal connection terminals 72 are used as the plurality of connection terminals 70, a distance between the base portion 50 and the busbar board 20 becomes large at the time of assembly. That is, a space of the component-receiving portion 31 is broadened by these long-and-thin power connection terminals 71 and the long-and-thin signal connection terminals 72. Thus, since the space of component-receiving portion 31 is broad, a heat-radiation performance of heat-generating components (such as electronic components mounted in the busbar board 20) is enhanced.

Each connection terminal 70 is provided to pass completely through the base portion 50. That is, end portions 71*b* of the pair of power connection terminals 71 which are located in another side (outer side of the case 30) relative to the extension direction of the pair of power connection terminals 71 protrude from an outer surface 50*a* of the base portion 50 in an outer direction of the case 30, as shown in FIGS. 2 and 3.

Figure 3:
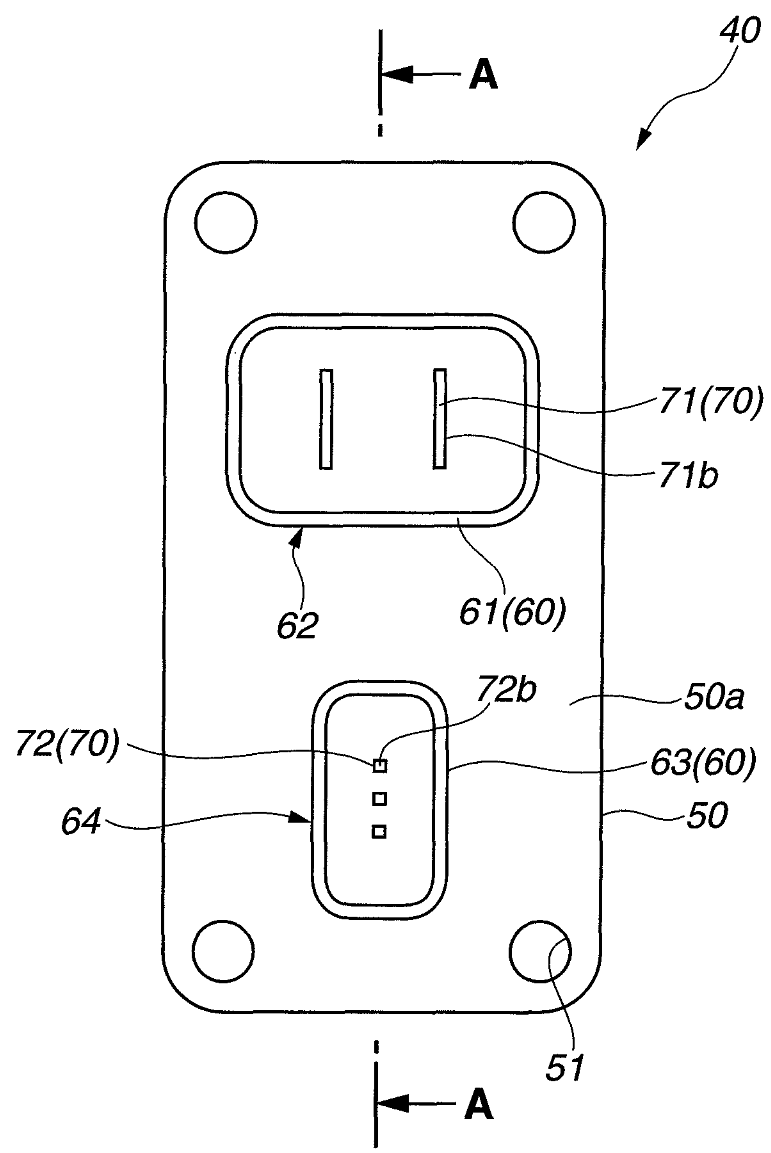
FIG. 3 is a front view of the connector according to the first embodiment of the present invention.

Moreover, end portions 72*b* of the signal connection terminals 72 which are located in another side (outer side of the case 30) relative to the extension direction of the signal connection terminals 72 also protrude from the outer surface 50*a* of base portion 50 in the outer direction of the case 30, as shown in FIGS. 2 and 3.

Wall portions 60 are provided on the outer surface 50*a* of base portion 50 so as to surround or fence the connection terminals 70 protruding in the outer direction of the case 30.

Specifically, in this embodiment, a wall portion 61 is provided to surround or fence the power connection terminals 71 so that a power external-connection port 62 is formed. This power external-connection port 62 functions to be connected with a harness which is connected to a direct-current power supply. Moreover, a wall portion 63 is provided to surround or fence the signal connection terminals 72 so that a signal external-connection port 64 is formed. This signal external-connection port 64 functions to be connected with a harness which is connected to an external ECU, sensors and the like.

In this example according to the first embodiment, the power external-connection port 62 and the signal external-connection port 64 are provided integrally in one base portion 50. However, according to the first embodiment, the power external-connection port 62 may be provided in one of two base portions, and the signal external-connection port 64 may be provided in another of the two base portions.

In this first embodiment, as shown in FIG. 2, condensers 90 are attached to the pair of power connection terminals 71. That is, the pair of power connection terminals 71 are electrically connected with each other by means of the condensers 90. It is noted that each condenser 90 corresponds to a second electronic component (or simply, an electronic component) according to the present invention, and the pair of power connection terminals 71 correspond to at least two connection terminals according to the present invention.

Since the condensers 90 electrically connect the pair of power connection terminals 71 with each other, noises or static electricity can be prevented from entering the case 30 (toward the busbar board 20) from an external region.

Figure 8A:
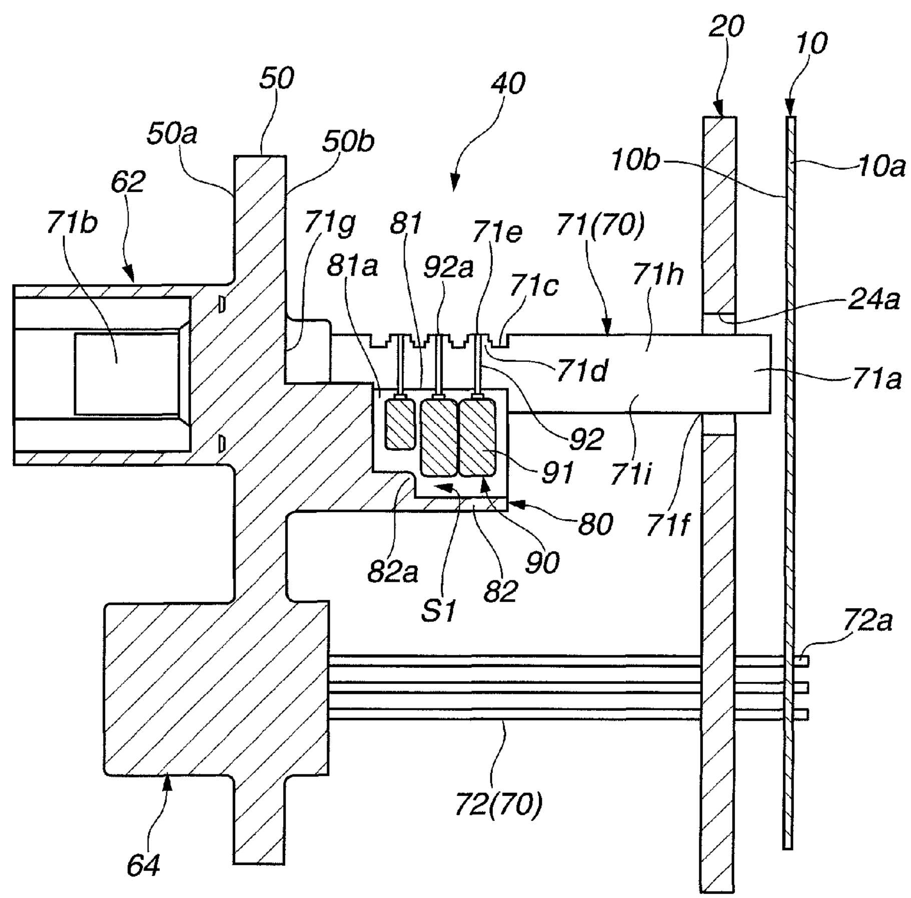
FIG. 8A is a cross sectional view of the connector according to the first embodiment of the present invention, taken along a line A-A of FIG. 3.
Figure 8B:
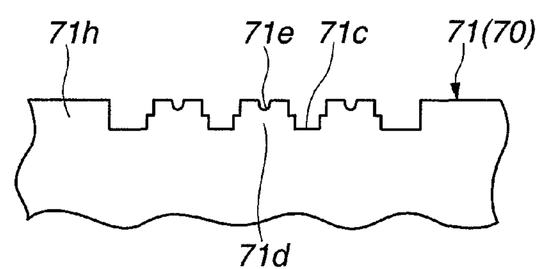
FIG. 8B is an enlarged side view of an electronic-component attaching portion of a power connection terminal of the connector according to the first embodiment.

In this embodiment, as shown in FIGS. 5 and 8, three condensers 90 are used. The three condensers 90 include two condensers having sizes approximately equal to each other, and one condenser having a size smaller than these two condensers (i.e., having a different size from these two condensers). Each of the three condensers 90 is attached to the pair of power connection terminals 71.

Each condenser 90 includes a body portion 91 and a pair of lead wires 92. The body portion 91 is formed in a substantially rectangular-parallelepiped shape. The pair of lead wires 92 extend from one end side of the body portion 91. By welding the pair of lead wires 92 respectively to the pair of power connection terminals 71, the pair of power connection terminals 71 are electrically connected with each other through the condenser 90. As this welding method, a TIG welding, a spot welding, a solder welding, a laser welding, an electron beam welding, an ultrasonic welding and the like can be employed.

Figure 4:
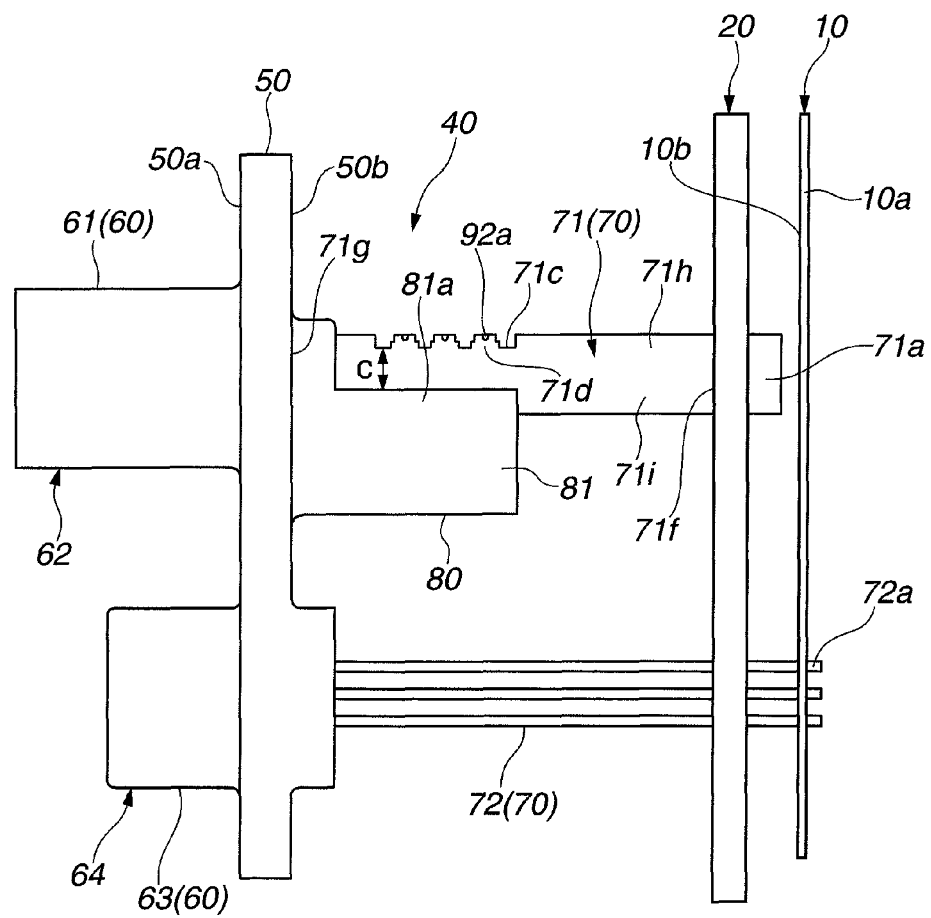
FIG. 4 is a side view of the connector according to the first embodiment of the present invention.

In this embodiment, one end portion (upper side in FIG. 4) 71*h* of each power connection terminal 71 relative to a width direction of the power connection terminal 71 is formed with a plurality of groove portions 71*c*. The plurality of groove portions 71*c* are formed by denting the one end portion 71*h* toward another end portion (lower side in FIG. 4) 71*i* of each power connection terminal 71 relative to the width direction, so that three convex portions 71*d* are formed. That is, the plurality of groove portions 71*c* are formed in one end portion 71*h* of each power connection terminal 71 relative to the width direction so as to provide the convex portions 71*d* each protruding in one direction (upper direction of FIG. 4) of the width direction. Each convex portion 71*d* is formed with a groove portion 71*e* located in an approximately center portion of the convex portion 71*d* relative to the extension direction of power connection terminal 71 (i.e., relative to the insertion direction of the connector 40 toward the case 30). This groove portion 71*e* is shallower than the groove portion 71*c*. A tip portion of each lead wire 92 is mounted in (attached into) the groove portion 71*e*, as shown in FIG. 8.

The three convex portions 71*d* are formed in a range from a connecting portion 71*f* between the busbar board 20 and the power connection terminal 71 to a fixing portion (base-portion side) 71*g* between the power connection terminal 71 and the base portion 50. The large and small three condensers 90 are attached respectively to the three convex portions 71*d*.

In this embodiment, the three convex portions 71*d* are formed at a location near the base portion 50 relative to the extension direction of power connection terminal 71. That is, the location of the three convex portions 71*d* is closer to the fixing portion 71*g* than the connecting portion 71*f*.

A protecting portion 80 for protecting the condensers 90 is provided to at least one of the base portion 50 and the pair of power connection terminals 71 to which the condensers 90 are attached. In this example according to the first embodiment, the protecting portion 80 is provided on a side of the width-directional another end portions 71*i* of the pair of power connection terminals 71. This protecting portion 80 extends from an inner surface 50*b* of the base portion 50 (i.e., from a base portion 50's surface facing the printed circuit board 10) toward the printed circuit board 10. The protecting portion 80 is formed integrally with the base portion 50 by insert molding.

In this embodiment, the protecting portion 80 is formed to straddle a region between the width-directional another end portion 71*i* of one of the pair of power connection terminals 71 and the width-directional another end portion 71*i* of another of the pair of power connection terminals 71.

Figure 7:
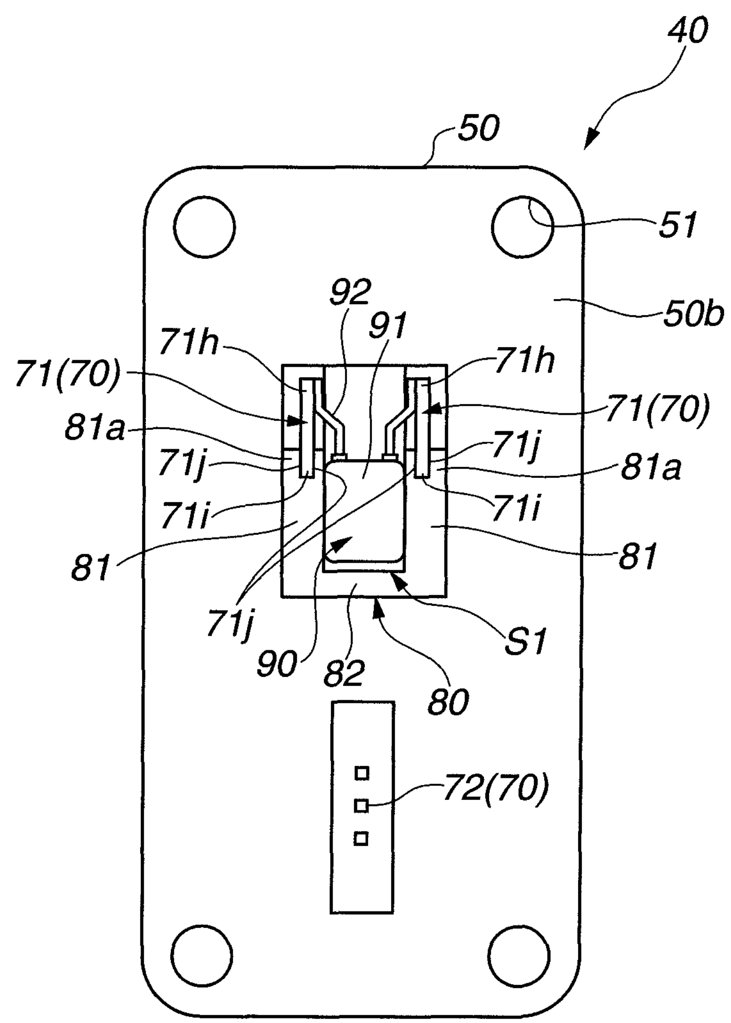
FIG. 7 is a rear view of the connector according to the first embodiment of the present invention.

Specifically, the protecting portion 80 includes lateral walls 81 and 81 and a bottom wall 82, and thereby is formed in a substantially U shape. These lateral walls 81 and 81 and bottom wall 82 define a space portion S1 for accommodating or receiving the condensers 90, as shown in FIGS. 7 and 8.

In this embodiment, an upper end portion 81*a* of each lateral wall 81 covers flat surface portions 71*j* of both sides (relative to a facing direction of the pair of power connection terminals 71) of the width-directional another end portion 71*i* of the power connection terminal 71. Thereby, a predetermined clearance C is given between an upper end of the lateral wall 81 and a bottom of the groove portion 71*c*. Thus, by forming the clearance C between the upper end of lateral wall 81 and the bottom portion of groove portion 71*c*, it becomes easy to attach a welding electrode to the power connection terminal 71 when welding each lead wire 92 to the power connection terminal 71. Accordingly, an workability of the welding is improved.

In this embodiment, under a state where the body portion 91 of each of the small and large three condensers 90 has been accommodated within the space portion S1 and where the lead wires 92 have been welded respectively to the convex portions 71*d* of the pair of power connection terminals 71, liquid resin (not shown) is injected into the space portion S1. Thereby, the condensers 90 are fixed. Under this state, the upper end of lateral wall 81 is located above an upper end of each body portion 91, relative to the upper-lower direction of FIG. 8A (relative to the width direction of power connection terminal 71).

It is preferable that a silicon-series resin which has a relatively high elasticity also after its adhesion is used as the above-mentioned liquid resin. By fastening the condensers 90 by use of such a silicon-series resin, a deformation of the resin itself can be permitted (offset) at the time of heat shrinkage and the like, so that a stress which is applied to the body portion 91 of condenser 90 or a fixed portion (welded portion) 92*a* of the lead wire 92 can be relieved. Accordingly, the adhered resin can be inhibited (suppressed) from becoming cracked. Moreover, the body portion 91 and the lead wire 92 of the condenser 90 can be inhibited from being broken or damaged. Furthermore, the fixed portion (welded portion) 92*a* of lead wire 92 can be inhibited from being damaged.

By filling the space portion S1 with the silicon-series resin to secure the condensers 90, the body portion 91 and lead wires 92 of each condenser 90 and the fixed portion (welded portion) 92*a* of the lead wire 92 can be protected more reliably.

In the case that the condensers 90 are fixed by use of the silicon-series resin having a relatively high elasticity, the silicon-series resin itself is deformed at the time of generation of vibration. By virtue of this deformation, the stress which is applied to each condenser 90 can be eased as mentioned above. However, if an amount of the silicon-series resin is large, an amount (degree) of the deformation of silicon-series resin itself is large, so that a relatively large stress caused due to the deformation of silicon-series resin itself is applied to the condensers 90. That is, in a case that a percentage (share) of the silicon-series resin in the space portion S1 is large, a relatively large stress is applied to the condensers 90 due to the deformation of silicon-series resin itself generated by vibration and like. Hence, in this case, the deformation of silicon-series resin itself generated by vibration greatly influences the condensers 90.

Therefore, as shown in FIG. 8A, a step portion 82*a* is formed on a portion of the bottom wall 82 which is located on the side of space portion S1. In a space which is included in the space portion S1 and which is formed by a lower stage of the step portion 82*a* (i.e., a space which is above a thin portion of the bottom wall 82), the two large condensers 90 are disposed (accommodated). On the other hand, in a space which is included in the space portion S1 and which is formed by a higher stage of the step portion 82*a* (i.e., a space which is above a thick portion of the bottom wall 82), the small condenser 90 is disposed (accommodated).

Thus, the step portion 82*a* is provided to an inner surface of the bottom wall 82 which faces the space portion S1, and thereby, an accommodation space is set according to the size of each condenser 90. Accordingly, the percentage of the silicon-series resin inside the space portion S1 is inhibited from becoming large. As a result, it can be suppressed that each condenser 90 attached to the power connection terminals 71 receives the influence of vibration.

The connector 40 having the above-mentioned structures is manufactured as follows.

At first, the three signal connection terminals 72 and the pair of power connection terminals 71 are disposed at predetermined locations inside the mold. At this time, the convex portions 71*d* and the groove portions 71*e* and 71*c* have been formed in the width-directional one end side of each power connection terminal 71, in advance. Then, the insulating synthetic resin (for example, PBT (polybutylene terephthalate), PPS (polyphenylene sulfide) or PA (polyamide)) is inputted into the mold in which the signal connection terminals 72 and the power connection terminals 71 have been disposed. By consolidating the inputted synthetic resin; the power connection terminals 71, the signal connection terminals 72 and the base portion 50 are formed by insert molding. At the same time, the wall portions 60 and the protecting portion 80 are formed by the insert molding.

Next, the body portion 91 of each condenser 90 is accommodated (disposed) inside the space portion S1 formed at the protecting portion 80, while placing the two lead wires 92 of the condenser 90 respectively into the groove portions 71*e* of the pair of power connection terminals 71.

Next, the respective lead wires 92 are welded to the power connection terminals 71, so that the pair of power connection terminals 71 are electrically connected with each other through the condenser 90.

Finally, the liquid resin is inputted into the space portion S1 of the protecting portion 80 so that the liquid resin adheres to the respective condensers 90. Thus, the connector 40 is formed.

As explained above, in this embodiment, each condenser 90 is attached to the pair of power connection terminals 71 so as to electrically connect the pair of power connection terminals 71 with each other via the condenser 90. Accordingly, a space (a space sandwiched between the pair of power connection terminals 71) which exists as a dead space in previous techniques in the art can be effectively used as an arrangement space for electronic components in this embodiment. As a result, the connector 40 can be downsized. Thereby, the control unit (electronic apparatus) 1 of electric power steering system can be further downsized.

Specifically, since the condenser 90 electrically connects the pair of power connection terminals 71 with each other, the number of the first electronic components (such as the condenser 21) which should be mounted in the printed circuit board 10 or the busbar board 20 can be reduced. That is, the electronic components which are mounted in the printed circuit board 10 or the busbar board 20 as the first electronic components in the other techniques in the art are used as the second electronic components in this embodiment. Thereby, the number of the first electronic components which are mounted in the printed circuit board 10 or the busbar board 20 becomes small so that the printed circuit board 10 and the busbar board 20 can be further downsized according to this embodiment.

In other words, in a case that the printed circuit board 10 and the busbar board 20 which have sizes same as the other techniques are used, the number of whole electronic components (total number of the first and second electronic components) that can be mounted in the control unit 1 of electric power steering system can be increased in this embodiment according to the present invention. That is, more electronic components can be mounted in the control unit (electronic apparatus) 1 of electric power steering system without upsizing the control unit 1.

Moreover, the condensers (the second electronic components) 90 are attached to the flat-plate-shaped power connection terminals 71 each of which is welded to the busbar board 20. That is, the condensers 90 are attached to the power connection terminals 71 that are insusceptible to the influence of vibration. Hence, each condenser (the second electronic component) 90 can be inhibited from receiving the influence of vibration. As a result, a load can be inhibited from being applied to the fixed portion (welded portion) 92*a* due to a vibration of the condenser 90. Therefore, a faulty electrical continuity between the condenser 90 and the power connection terminal 71 can be suppressed.

In this embodiment, the convex portions 71*d* are formed at the with-directional one end portion 71*h* of each of the pair of power connection terminals 71, and the condensers 90 are attached to the convex portions 71*d* by welding. Since the lead wires 92 of the condensers 90 are welded to the convex portions 71*d*, the welding can be performed with a low welding energy, as compared with a case that the lead wires 92 are welded under a state where the lead wires 92 have been placed on a width-directional end portion of a power connection terminal which was straightly formed (without the convex portion 71*d*). Accordingly, a power consumption can be reduced, and also, a time necessary for the welding can be shortened.

Moreover, since the welding is performed at the convex portions 71*d*, it can be suppressed that the melting amount of a welding material at the time of welding is varied among the respective welding spots (among the respective lead wires 92), as compared with the case that the lead wires 92 are welded under the state where the lead wires 92 have been placed on the straightly-formed width-directional end portion of power connection terminal. Furthermore, since the welding is performed at the convex portions 71*d*, a flow movement of the melted welding material can be suppressed. Thereby, a welding strength can be inhibited from varying among the respective welding spots (i.e., among the fixed portions (welded portions) 92*a*). Thus, by welding the convex portions 71*d*, it becomes easy to adjust the melting amount of the welding material at the time of welding. Accordingly, a workability of the welding can be improved.

Moreover, in this embodiment, the tip portion of each lead wire 92 is mounted into the groove portion 71*e*. Accordingly, a positioning of each condenser 90 relative to the pair of power connection terminals 71 is performed when placing the both lead wires 92 into the groove portions 71*e*. That is, the position of each condenser 90 can be inhibited from being shifted (moved) at the time of welding.

Moreover, in this embodiment, the convex portions 71*d* are located near the base portion 50 relative to the extension direction of power connection terminals 71. That is, the condensers 90 are attached to the power connection terminals 71 at a location which is near the base portion 50 and which is away from the printed circuit board 10 and the busbar board 20. Thus, by attaching the condensers 90 at the location away from the printed circuit board 10 and the busbar board 20, noises and static electricity which try to enter the case 30 from an external region can be blocked at an entrance side of the connector 40. As a result, it can be suppressed that the noises or the static electricity derived from the external region are transmitted through an air existing between the base portion 50 and the circuit boards (the printed circuit board 10, the busbar board 20) so that the printed circuit board 10 or the busbar board 20 is affected.

Moreover, in this embodiment, the protecting portion 80 for protecting the condensers 90 is provided to at least one of the base portion 50 and the pair of power connection terminals 71. Thus, by providing the protecting portion 80, a load produced due to vibration can be inhibited from being applied to the fixed portion (welded portion) 92*a* of each condenser 90. Accordingly, a faulty electrical continuity can be inhibited from occurring between the condenser 90 and the power connection terminal 71.

Moreover, in this embodiment, the protecting portion 80 straddles the region between the width-directional another end portion 71*i* of one of the pair of power connection terminals 71 and the width-directional another end portion 71*i* of another of the pair of power connection terminals 71. That is, tip portions of the both lateral walls 81 and 81 are respectively in contact with the width-directional another end portion 71*i* of one of the pair of power connection terminals 71 and the width-directional another end portion 71*i* of another of the pair of power connection terminals 71. Hence, the protecting portion 80 is formed to surround the body portion 91 of each condenser 90. As a result, the vibration of power connection terminals 71 can be suppressed at the mounting region of condensers 90. It can be further suppressed that the conduction between the condenser 90 and the power connection terminal 71 is blocked.

Next, modified examples of the connector according to the first embodiment will be explained.

First Modified Example

Figure 9A:
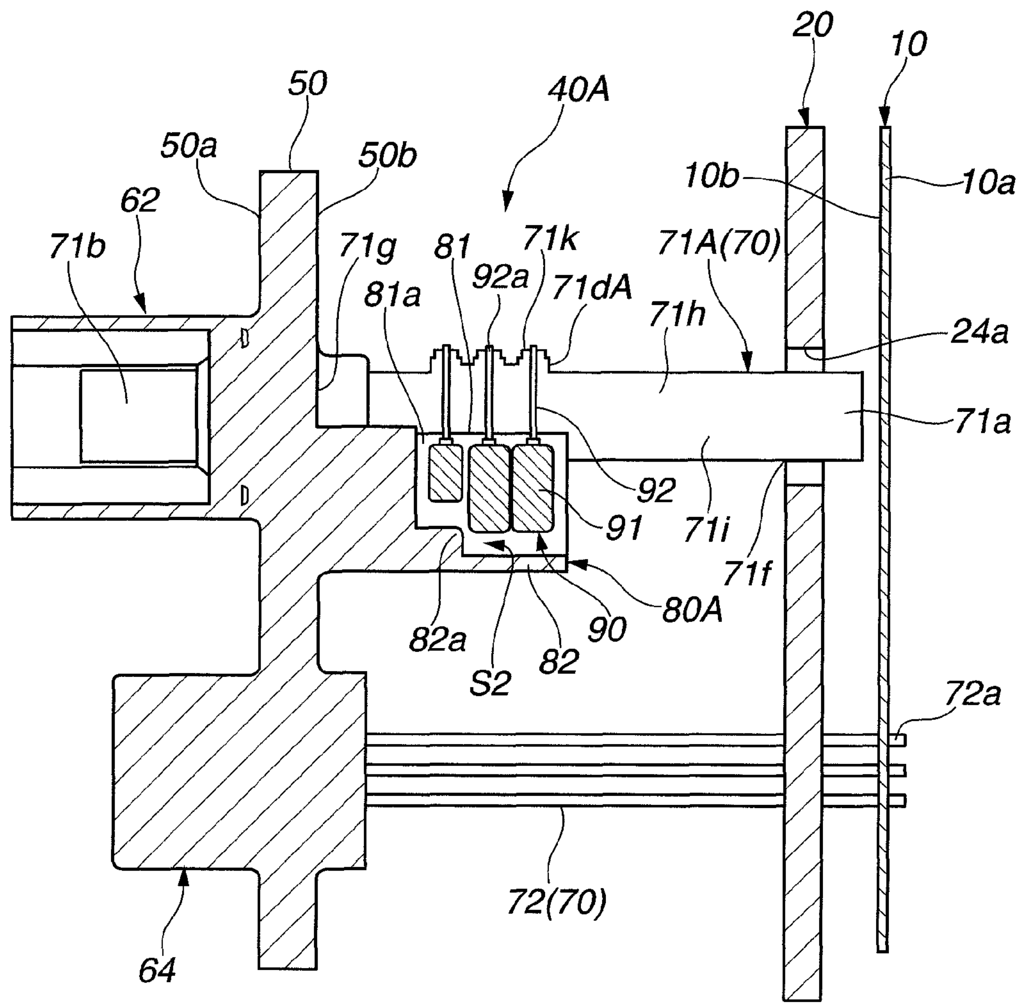
FIG. 9A is a cross sectional view of a connector in a first modified example according to the first embodiment of the present invention.
Figure 9B:
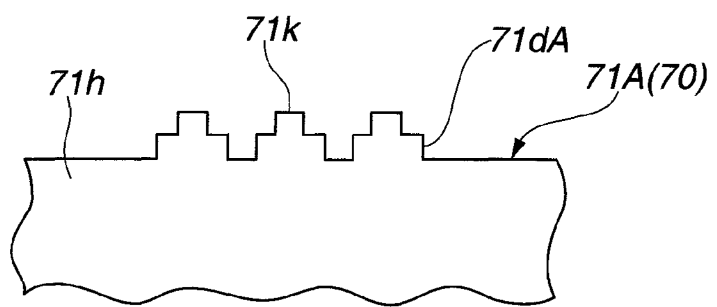
FIG. 9B is an enlarged side view of an electronic-component attaching portion of a power connection terminal of the connector in the first modified example.

At first, a connector 40A in a first modified example according to the first embodiment will now be explained referring to FIGS. 9A and 9B.

The connector 40A in this modified example has a structure basically similar to the connector 40 of the above pre-modified example according to the first so embodiment. In this modified example, the connector 40A includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71A. Thereby, the pair of power connection terminals 71A are electrically connected with each other through the condensers 90.

A protecting portion 80A functioning to protect the condensers 90 are provided to at least one of the base portion 50 and the pair of power connection terminals 71A. Thereby, a space portion S2 for accommodating the condensers 90 is formed inside the protecting portion 80A.

In this modified example, one end portion 71*h* (upper side in FIG. 9A) of each of the pair of power connection terminals 71A relative to the width direction of power connection terminal 71A is formed with three convex portions 71*d*A each protruding in an upper direction (in the width direction), as is mainly different from the above-mentioned pre-modified example according to the first embodiment. That is, the three convex portions 71*d*A protrude in the width direction from a width-directional edge surface of one end portion 71*h* (i.e., from an upper surface of the one end portion 71*h* in FIG. 9A). Moreover, a protrusion 71*k* is formed on an approximately center portion of each convex portion 71*d*A relative to the extension direction of power connection terminal 71A (the insertion direction of the connector 40A toward the case 30). Each protrusion 71*k* protrudes from the convex portion 71*d*A, i.e., protrudes more upwardly than the convex portion 71*d*A. The read wire 92 is mounted on the protrusion 71*k*.

Thus, also in the case that the convex portions 71*d*A are formed by causing some portions of the width-directional one end portion 71*h* of power connection terminal 71A to protrude upwardly from the other portions of the width-directional one end portion 71*h*, the welding can be performed with a low welding energy as compared with the case that the lead wires 92 are welded under the state where the lead wires 92 have been placed on a straightly-formed width-directional end portion of a power connection terminal. Alternatively, a groove portion into which the lead wire 92 is mounted may be provided in an upper edge portion of each convex portion 71*d*A. Also in this case, operations and effects similar to the above can be obtained.

Also in this modified example, operations and effects similar to the pre-modified example can be obtained.

Second Modified Example

Next, a connector 40B in a second modified example according to the first embodiment will now be explained referring to FIG. 10.

The connector 40B in this modified example has a structure basically similar to the connector 40 of the above pre-modified example according to the first embodiment. In this modified example, the connector 40B includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71B. Thereby, the pair of power connection terminals 71B are electrically connected with each other through the condensers 90.

In the same manner as the pre-modified example, groove portions 71*c* are formed in one end portion (upper side in FIG. 10) 71*h* of each power connection terminal 71B relative to the width direction of power connection terminal 71B. Each of the groove portions 71*c* is formed by denting the one end portion 71*h* toward another end portion (lower side in FIG. 10) 71*i* of the power connection terminal 71B relative to the width direction, so that convex portions 71*d* are formed. The groove portion 71*e* is formed in an approximately center portion of each convex portion 71*d* relative to the extension direction of power connection terminal 71B (the insertion direction of the connector 40B toward the case 30). This groove portion 71*e* is shallower than the groove portion 71*c*. Each lead wire 92 is mounted in (attached into) the groove portion 71*e*.

Figure 10:
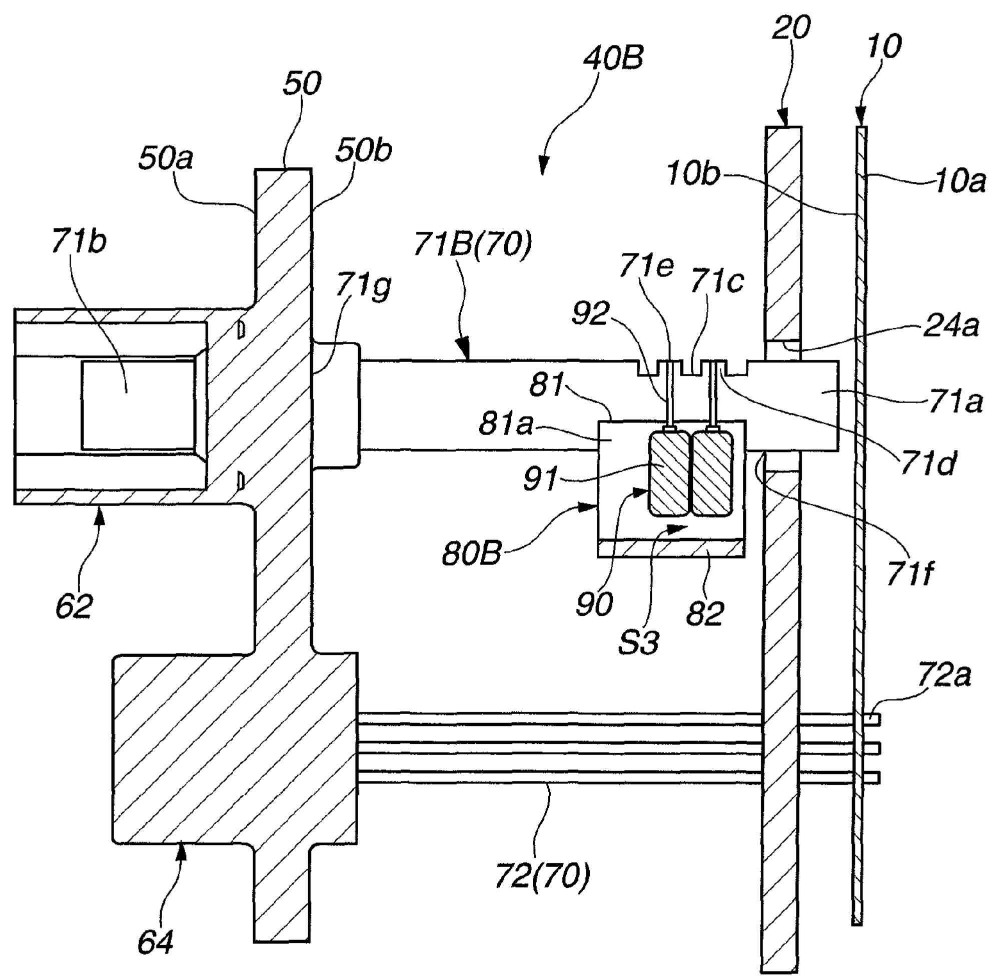
FIG. 10 is a cross sectional view of a connector in a second modified example according to the first embodiment of the present invention.

In this modified example, as shown in FIG. 10, the two convex portions 71*d* are formed near the connecting portion 71*f*, as is mainly different from the above-mentioned pre-modified example according to the first embodiment. That is, locations of the two convex portions 71*d* are closer to the connecting portion 71*f* between the power connection terminal 71B and the busbar board 20 than the fixing portion 71*g* between the power connection terminal 71B and the base portion 50. Two condensers 90 having sizes approximately equal to each other are attached respectively to the two convex portions 71*d*.

A protecting portion 80B is formed to straddle between the width-directional another end portion 71*i* of one of the pair of power connection terminals 71B and the width-directional another end portion 71*i* of another of the pair of power connection terminals 71B, in the same manner as the pre-modified example.

That is, the protecting portion 80B includes the lateral walls 81 and 81 and the bottom wall 82. These lateral walls 81 and 81 and bottom wall 82 define a space portion S3 for accommodating or receiving the condensers 90. The upper end portion 81*a* of each lateral wall 81 covers flat surface portions 71*j* of both sides (relative to a facing direction of the pair of power connection terminals 71B) of the width-directional another end portion 71*i* of the power connection terminal 71B. In this modified example, the protecting portion 80B is provided as a member separated from the base portion 50, as shown in FIG. 10.

Also in this modified example, operations and effects similar to the above pre-modified example can be obtained.

Additionally in this modified example, the two convex portions 71*d* are formed near the connecting portion 71*f* between the power connection terminal 71B and the busbar board 20. That is, the condensers 90 are mounted in proximity to the connecting portion 71*f* which causes a less vibration or no vibration. Accordingly, a breakage of the fixed portion (welded portion) 92*a* or a crack of the liquid resin due to vibration can be suppressed resulting in an improvement of product durability.

Second Embodiment

A connector 40C according to a second embodiment will now be explained referring to FIGS. 11 and 12.

The connector 40C according to the second embodiment has a structure basically similar to the above pre-modified example according to the first embodiment. In the second embodiment, the connector 40C includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71. Thereby, the pair of power connection terminals 71 are electrically connected with each other through the condensers 90.

Figure 11:
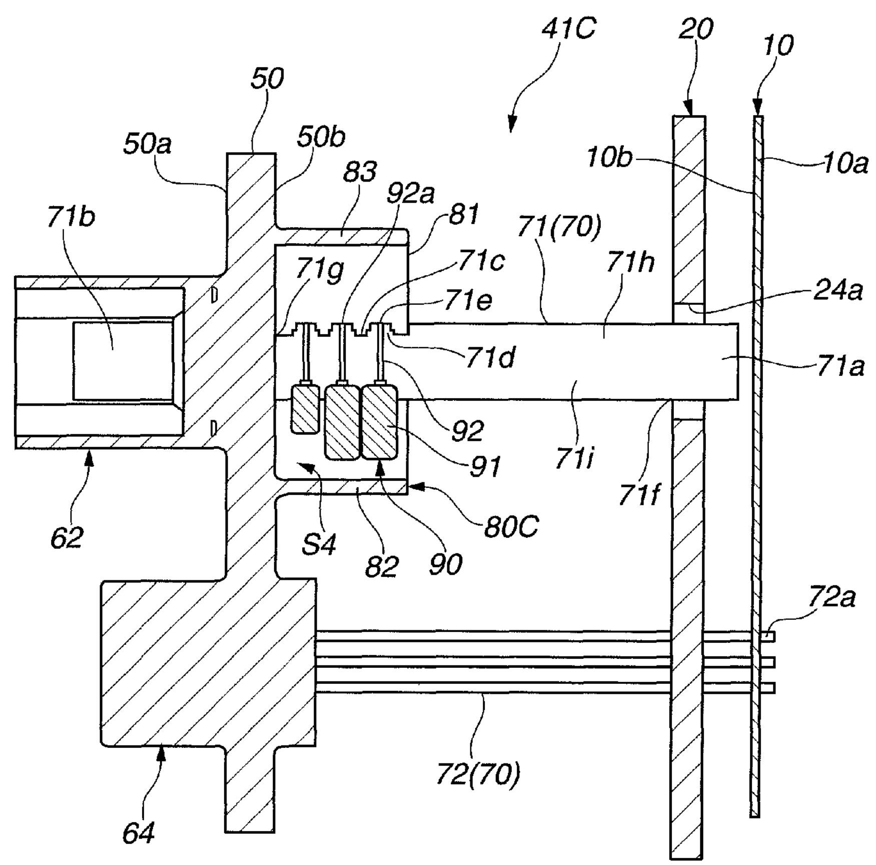
FIG. 11 is a cross sectional view of a connector according to a second embodiment of the present invention.
Figure 12:
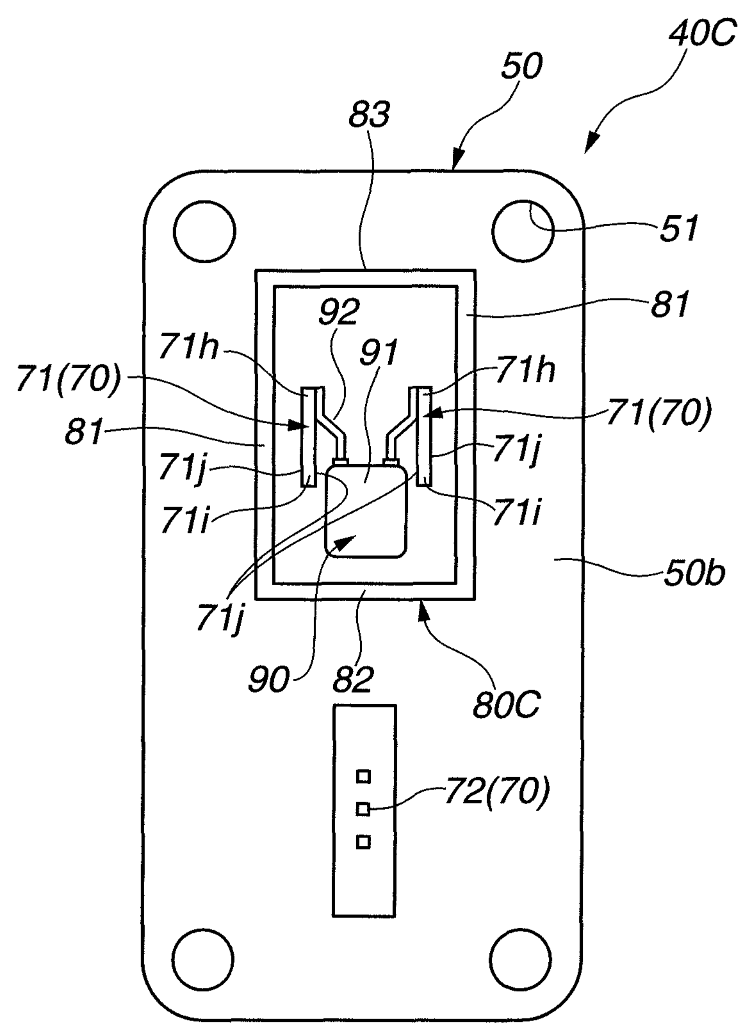
FIG. 12 is a rear view of the connector according to the second embodiment of the present invention.

In this second embodiment, as shown in FIGS. 11 and 12, a protection portion 80C is provided to surround the pair of power connection terminals 71 to which the condensers 90 are attached, as is mainly different from the above-mentioned pre-modified example according to the first embodiment.

Specifically, the protecting portion 80C extends from the inner surface 50*b* of base portion 50 (the base portion 50's surface facing the printed circuit board 10) so toward the printed circuit board 10 in a rectangular tube shape. This protecting portion 80C is formed integrally with the base portion 50 by insert molding.

That is, as shown in FIG. 12, the protecting portion 80C according to the second embodiment includes lateral walls 81 and 81, a bottom wall 82 and a ceiling wall portion 83. Thereby, the protecting portion 80C has a closed rectangular cross section which is taken along a plane perpendicular to the extension direction of the power connection terminals 71. Thereby, the protecting portion 80C forms a space portion S4 therein. That is, the lateral walls 81 and 81, the bottom wall 82 and the ceiling wall portion 83 define the space portion S4. Hence, the space portion S4 opens in the extension direction of power connection terminals 71 toward the printed circuit board 10 (the insertion direction of the connector 40C toward the case 30). The condensers 90 are accommodated or received in the space portion S4, as shown in FIG. 11.

Also in this second embodiment, the similar operations and effects as the above pre-modified example according to the first embodiment can be obtained.

Additionally, according to the second embodiment, since the protecting portion 80C is provided to completely surround the pair of power connection terminals 71 in a cross section taken along a plane perpendicular to the extension direction of power connection terminal 71, the liquid resin can be easily injected into the space portion S4. Moreover, the liquid resin injected into the space portion S4 can be prevented from leaking, so that the connector 40C can be manufactured more easily.

Third Embodiment

A connector 40D according to a third embodiment will now be explained referring to FIGS. 13 and 14.

The connector 40D according to the third embodiment has a structure basically similar to the second embodiment. In the third embodiment, the connector 40D includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71D. Thereby, the pair of power connection terminals 71D are electrically connected with each other through the condensers 90. It is noted that each of the pair of power connection terminals 71D corresponds to the connection terminal according to the present invention.

Figure 14:
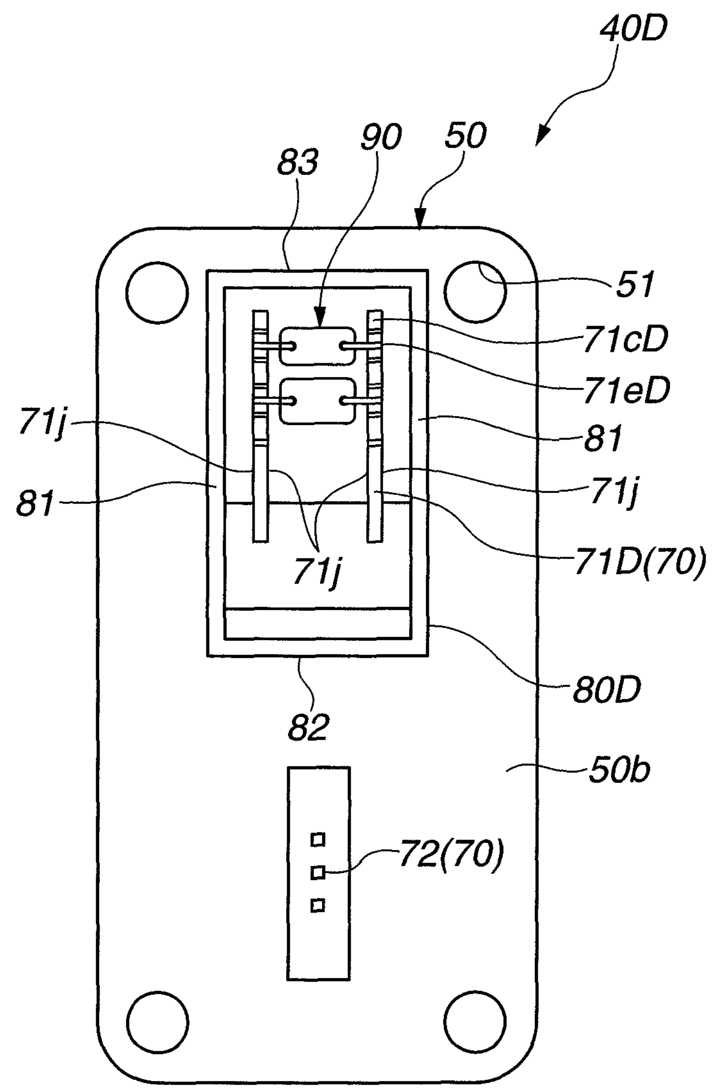
FIG. 14 is a rear view of the connector according to the third embodiment of the present invention.

A protection portion 80D is provided to surround the pair of power connection terminals 71D to which the condensers 90 are attached, as shown in FIG. 14.

That is, the protecting portion 80D extends from the inner surface 50*b* of base portion 50 (the base portion 50's surface facing the printed circuit board 10) toward the printed circuit board 10 in a rectangular tube shape. This protecting portion 80D is formed integrally with the base portion 50 by insert molding.

Specifically, as shown in FIG. 14, the protecting portion 80D according to the third embodiment includes lateral walls 81 and 81, a bottom wall 82 and a ceiling wall portion 83. Thereby, the protecting portion 80D has a closed rectangular cross section which is taken along a plane perpendicular to the extension direction of the power connection terminals 71D. Thereby, the protecting portion 80D forms a space portion S5 therein. That is, the lateral walls 81 and 81, the bottom wall 82 and the ceiling wall portion 83 define the space portion S5. Hence, the space portion S5 opens in the extension direction of power connection terminals 71D toward the printed circuit board 10 (the insertion direction of the connector 40D toward the case 30). The condensers 90 are accommodated or received in the space portion S5, as shown in FIG. 14.

In this third embodiment, condensers 90 are inserted from the opening side of the protecting portion 80D, as is mainly different from the above second embodiment.

Figure 13:
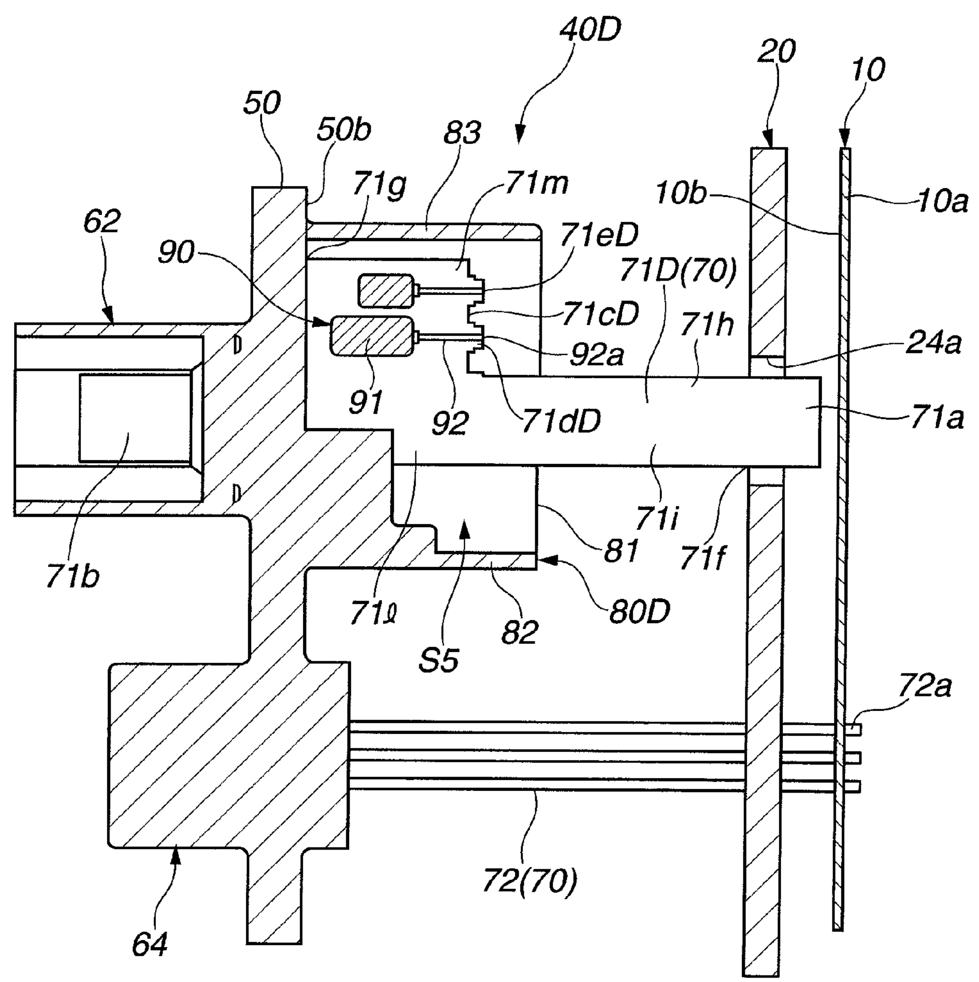
FIG. 13 is a cross sectional view of a connector according to a third embodiment of the present invention.

Specifically, each of the pair of power connection terminals 71D is formed in an L shape by enlarging a width of an end portion 71*l* of power connection terminal 71D which is located near the base portion 50, as shown in FIG. 13. In this example according to the third embodiment, the one end portion 71*h* of the end portion 71*l* is enlarged in the width direction of power connection terminal 71D (in a direction opposite to the signal connection terminals 72). That is, the end portion 71*l* extends parallel to the inner surface 50*b* of base portion 50, as shown in FIG. 13. The condensers 90 are attached to an end 71*m* of end portion 71*l* which faces the opening of the protecting portion 80D.

Moreover, in the third embodiment, a plurality of groove portions 71*c*D are formed by denting the opening-side end 71*m* of end portion 71*l* toward the inner surface 50*b* of base portion 50, so that convex portions 71*d*D are formed. That is, the plurality of groove portions 71*c* are formed in the opening-side end 71*m* so as to provide the convex portions 71*d*D each protruding in the extension direction of power connection terminal 71D toward the busbar board 20. Each convex portion 71*d*D is formed with a groove portion 71*e*D located in an approximately center portion of the convex portion 71*d*D relative to the width direction of power connection terminal 71D (upper and lower directions in FIG. 13). This groove portion 71*e*D is formed by denting the convex portion 71*d*D in the extension direction of power connection terminal 71D opposite to the busbar board 20, and is shallower than the groove portion 71*c*D. Each lead wire 92 is mounted in (attached into) the groove portion 71*e*D.

Thus, the condensers 90 can be inserted from the opening side of the protecting portion 80D.

Also according to this third embodiment, operations and effects similar to the above second embodiment can be obtained.

Additionally, according to the third embodiment, since the condensers 90 are inserted into the protecting portion 80D from the opening side of the protecting portion 80D, the insertion of condensers 90 into the space portion S5 can be conducted more easily.

Fourth Embodiment

A connector 40E according to a fourth embodiment will now be explained referring to FIGS. 15 and 16.

The connector 40E according to the fourth embodiment has a structure basically similar to the second embodiment. In the fourth embodiment, the connector 40E includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71E. Thereby, the pair of power connection terminals 71E are electrically connected with each other through the condensers 90. It is noted that each of the pair of power connection terminals 71E corresponds to the (plate-shape) connection terminal according to the present invention.

Figure 16:
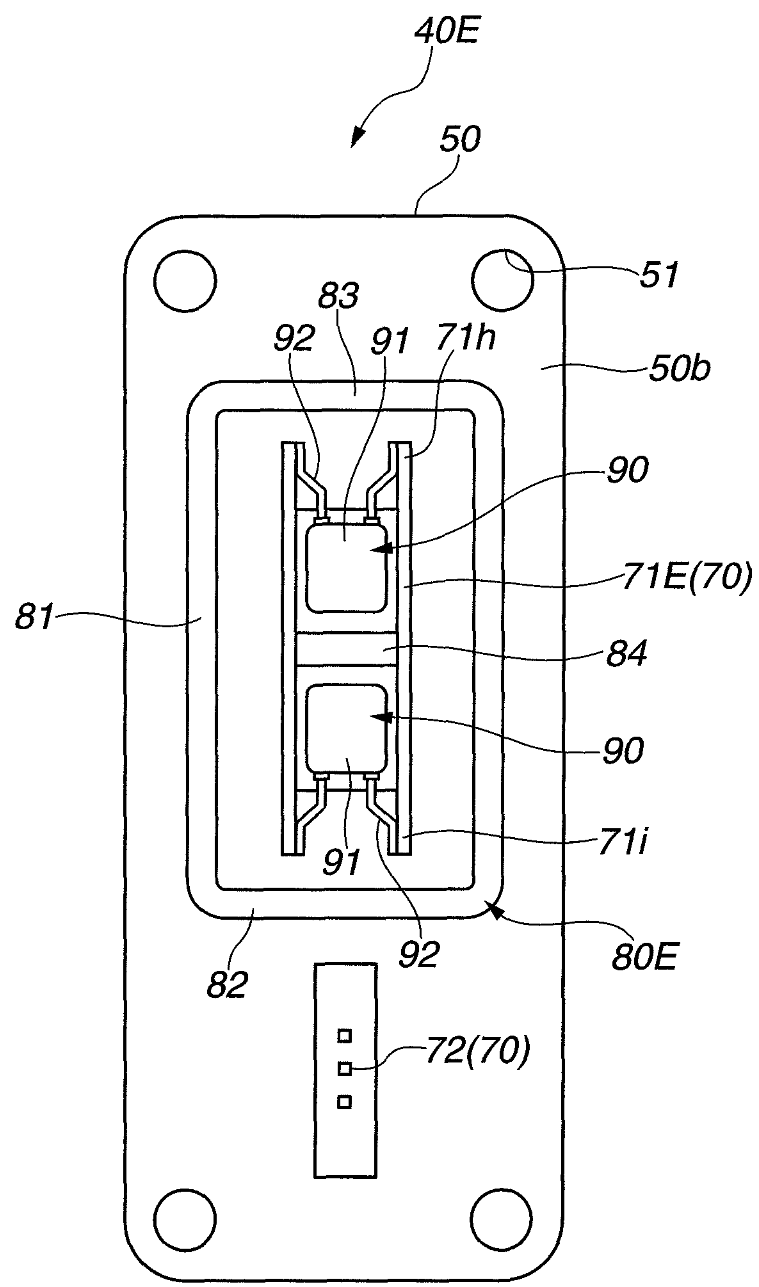
FIG. 16 is a rear view of the connector according to the fourth embodiment of the present invention.
Figure 17:
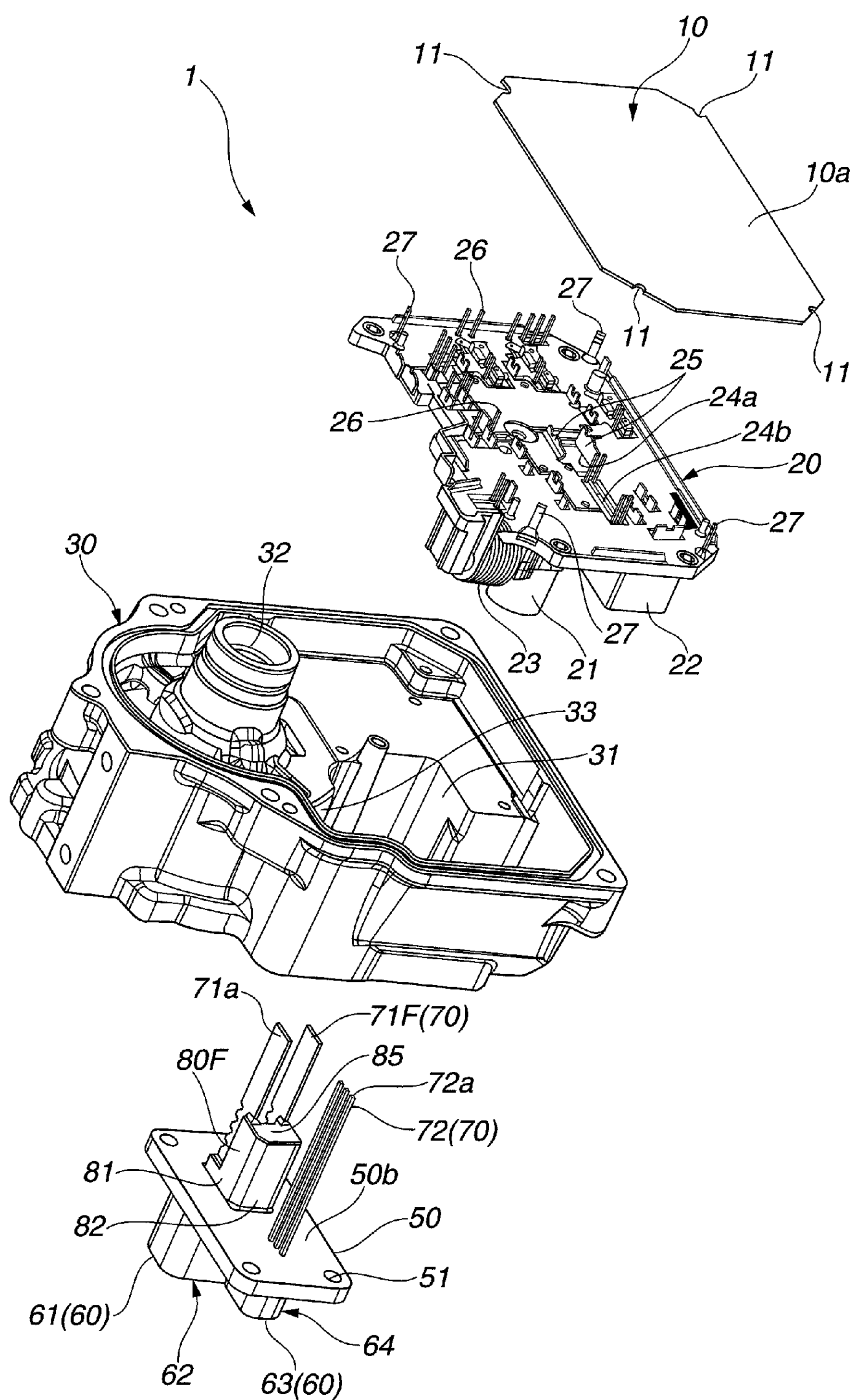
FIG. 17 is an exploded oblique perspective view showing a control unit of electric power steering system according to a fifth embodiment of the present invention.
Figure 18:
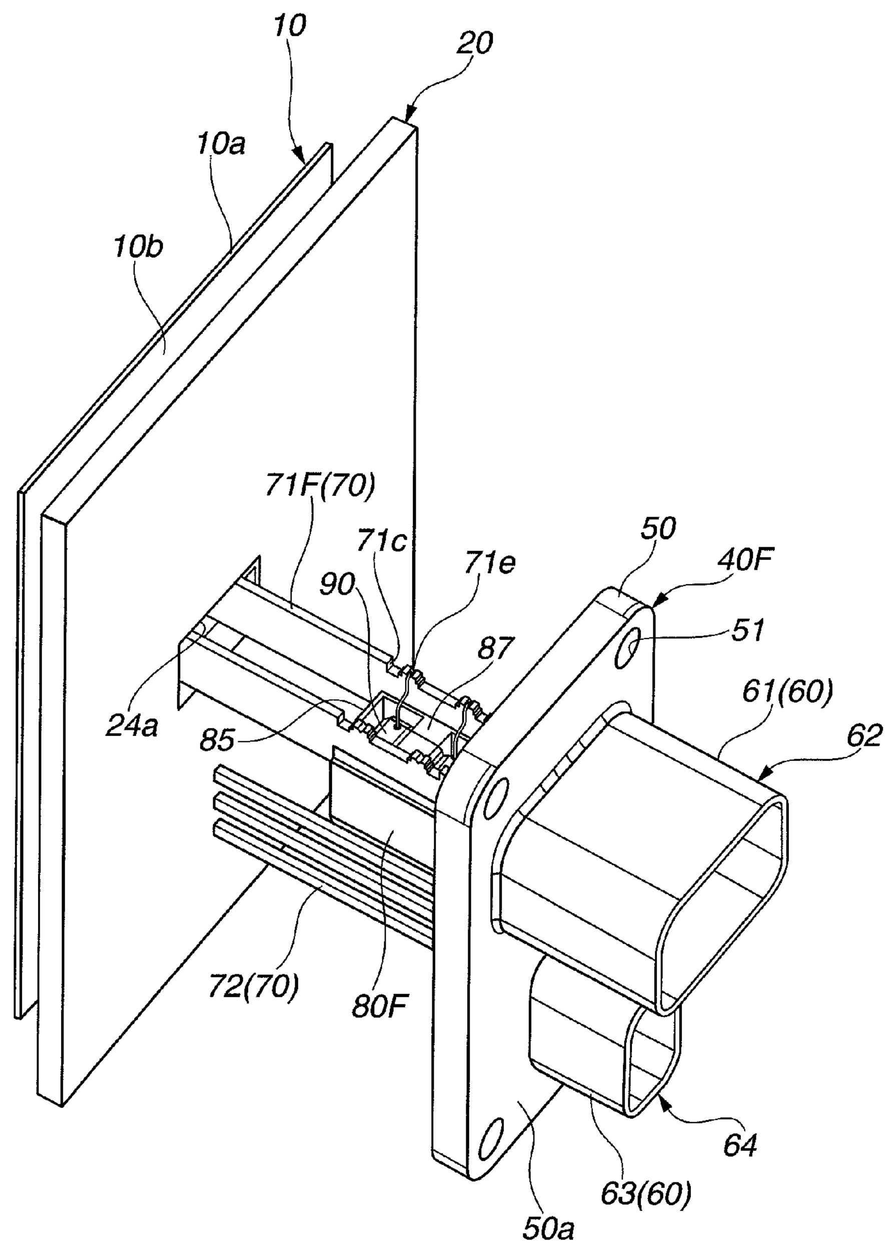
FIG. 18 is an oblique perspective view of a connector according to the fifth embodiment of the present invention.
Figure 19:
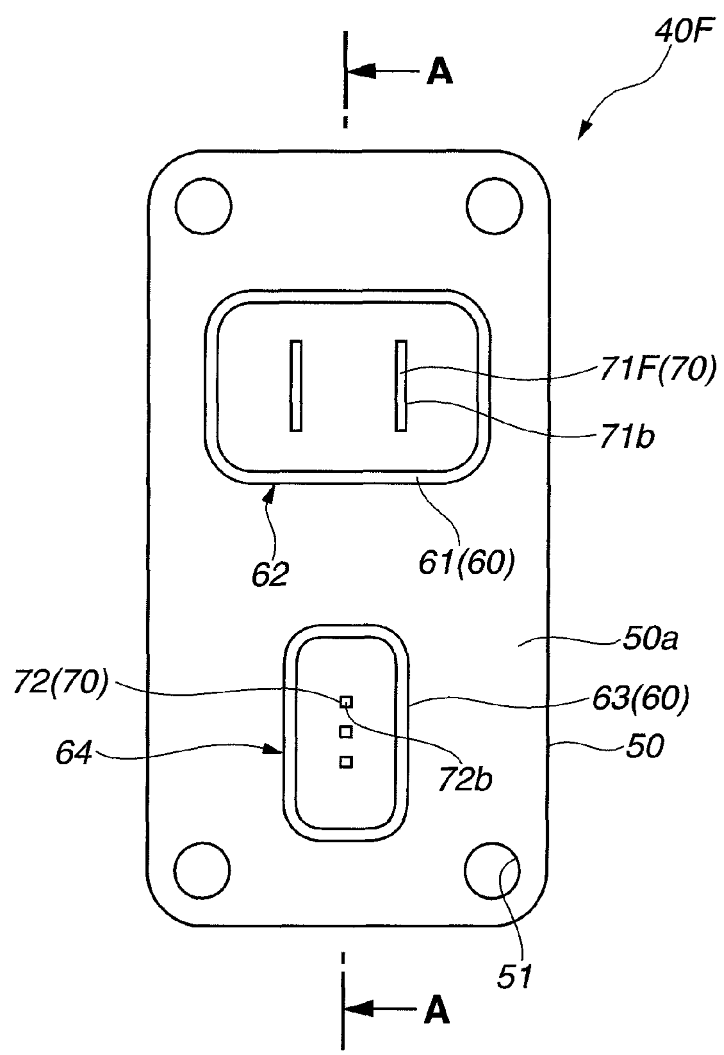
FIG. 19 is a front view of the connector according to the fifth embodiment of the present invention.
Figure 20:
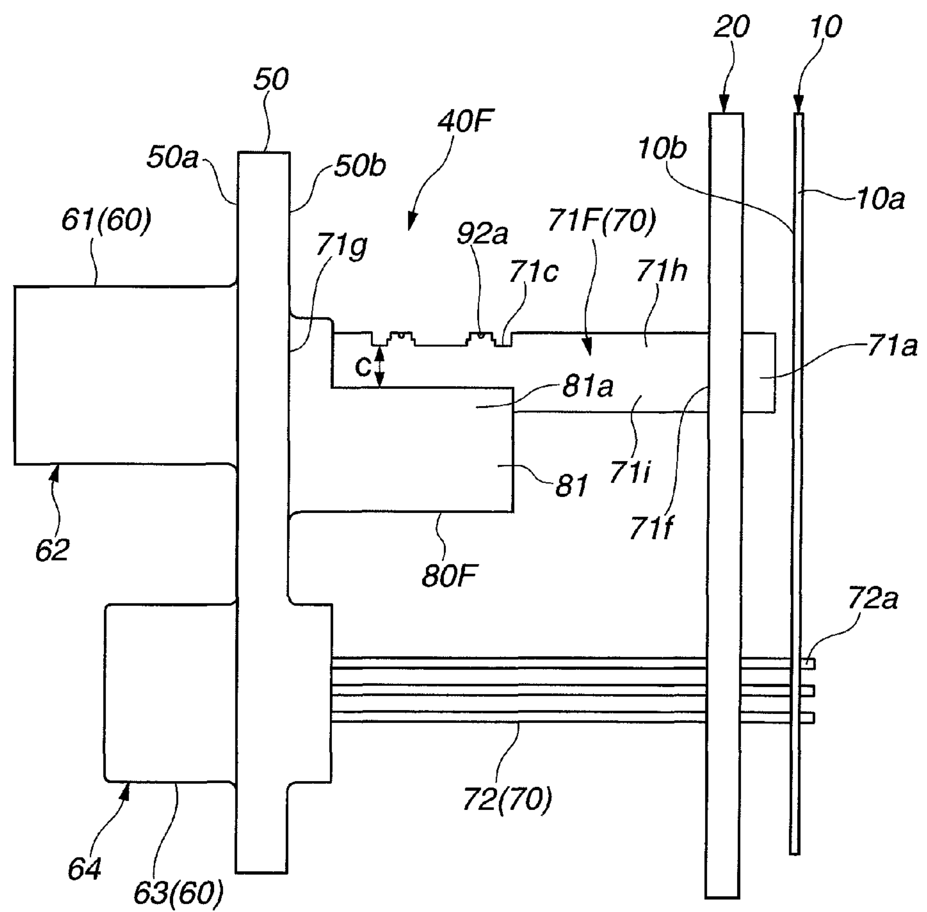
FIG. 20 is a side view of the connector according to the fifth embodiment of the present invention.

A protection portion 80E is provided to surround the pair of power connection terminals 71E to which the condensers 90 are attached, as shown in FIG. 16.

That is, the protecting portion 80E extends from the inner surface 50*b* of base portion 50 (the base portion 50's surface facing the printed circuit board 10) toward the printed circuit board 10 in a rectangular tube shape. This protecting portion 80E is formed integrally with the base portion 50 by insert molding.

Specifically, as shown in FIG. 16, the protecting portion 80E according to the fourth embodiment includes lateral walls 81 and 81, a bottom wall 82 and a ceiling wall portion 83. Thereby, the protecting portion 80E has a closed rectangular cross section which is taken along a plane perpendicular to the extension direction of the power connection terminals 71E. Thereby, the protecting portion 80E forms a space portion S6 therein. That is, the lateral walls 81 and 81, the bottom wall 82 and the ceiling wall portion 83 define the space portion S6. Hence, the space portion S6 opens in the extension direction of power connection terminals 71E toward the printed circuit board 10 (the insertion direction of the connector 40E toward the case 30). The condensers 90 are accommodated or received in the space portion S6.

Figure 15:
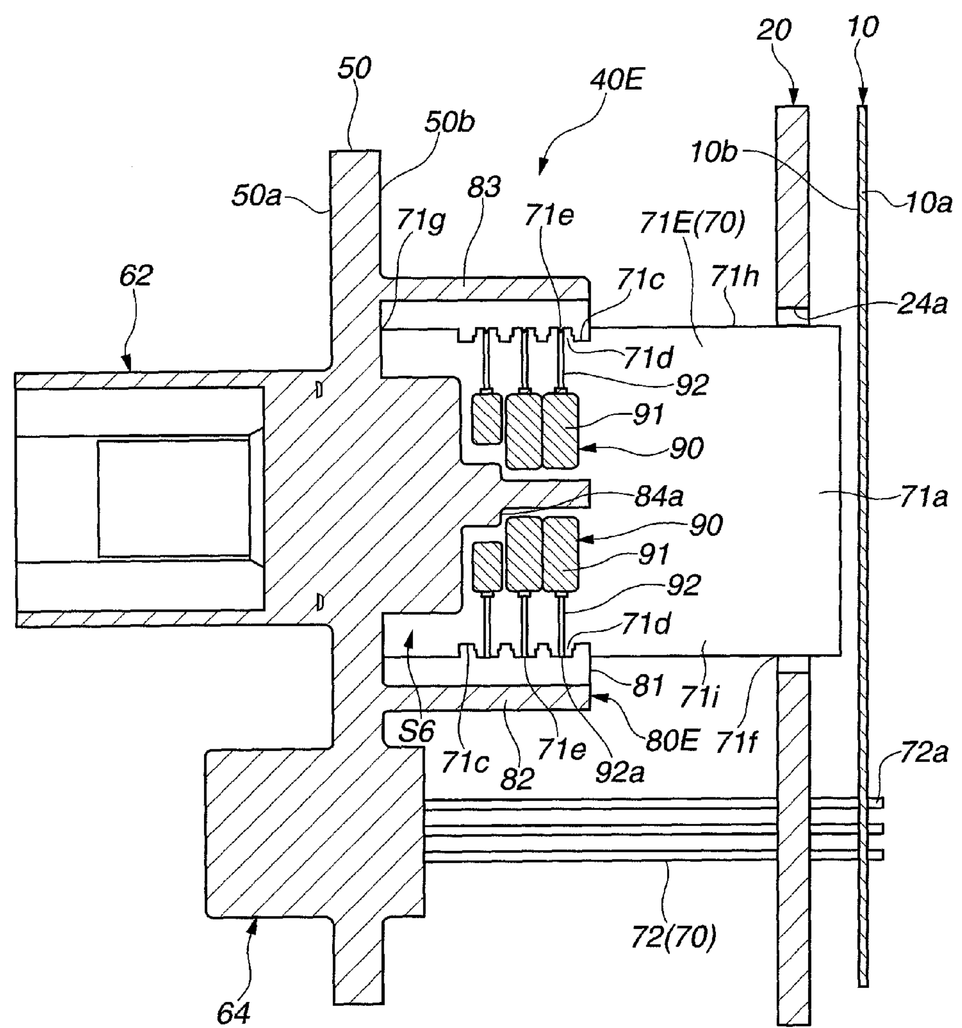
FIG. 15 is a cross sectional view of a connector according to a fourth embodiment of the present invention.

In this fourth embodiment, as shown in FIG. 15, the condensers 90 are provided to the width-directional both end portions 71*h* and 71*i* of each of the pair of power connection terminals 71E, as is mainly different from the above second embodiment.

In this fourth embodiment, each power connection terminal 71E has a large width. Hence, when mounting the condensers 90 to the both sides (the both end portions 71*h* and 71*i*) of power connection terminal 71E, the body portion 91 of condenser 90 which is mounted to the end portion 71*h* does not interfere with the body portion 91 of condenser 90 which is mounted to the end portion 71*i*. That is, the condenser 90 located in the end portion 71*h* does not overlap with the condenser 90 located in the end portion 71*i* as viewed in the extension direction of power connection terminals 71E, as shown in FIGS. 15 and 16.

A dividing wall 84 is provided at a center portion of each power connection terminal 71E relative to the width direction of power connection terminal 71E. This dividing wall 84 is provided between the pair of power connection terminals 71E which face each other. That is, the dividing wall 84 is formed to divide one side (the side of end portion 71*h*) of the power connection terminal 71E from another side (the side of end portion 71*i*) of the power connection terminal 71E relative to the width direction of power connection terminal 71E. Hence, a region sandwiched between the pair of power connection terminals 71E is divided into two regions by the dividing wall 84 as shown in FIG. 16.

A step portion 84*a* is provided in each of both surfaces of the dividing wall 84 relative to the width direction of power connection terminal 71E. That is, each of these width-directional both surfaces includes the step portion 84*a* that changes a thickness of the dividing wall 84 relative to the width direction of power connection terminal 71E. By virtue of this dividing wall 84, the space portion S6 is set at an accommodation space according to the sizes of condensers 90.

Also in this fourth embodiment, operations and effects similar to the above second embodiment can be obtained.

Additionally, according to the fourth embodiment, the condensers 90 can be attached to the width-directional both end portions 71*h* and 71*i* of each power connection terminal 71E. Hence, the large number of condensers 90 can be mounted.

Moreover, since the dividing wall 84 is provided between the pair of power connection terminals 71E so as to divide each power connection terminal 71E into one portion and another portion relative to the width direction of power connection terminal 71E, the condensers 90 attached to the power connection terminals 71E can be inhibited from being influenced by vibration. Therefore, the breakage of condensers 90 and the crack of the resin can be suppressed.

Fifth Embodiment

A connector 40F according to a fifth embodiment will now be explained referring to FIGS. 17 to 23.

Figure 21:
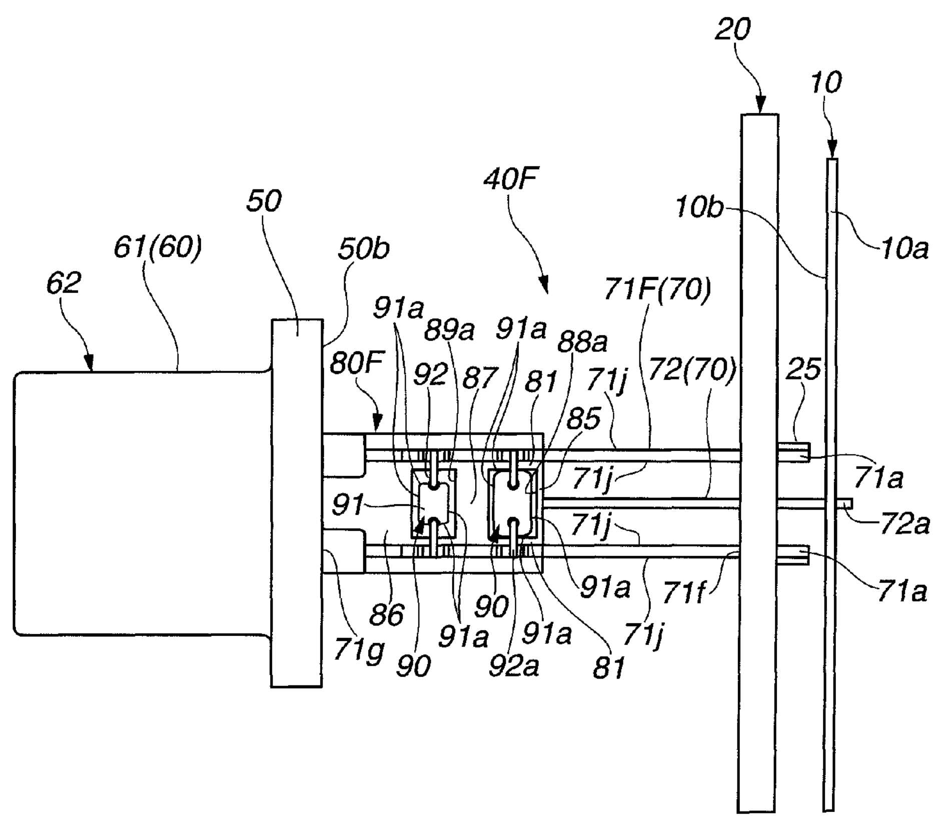
FIG. 21 is a top view of the connector according to the fifth embodiment of the present invention.
Figure 22:
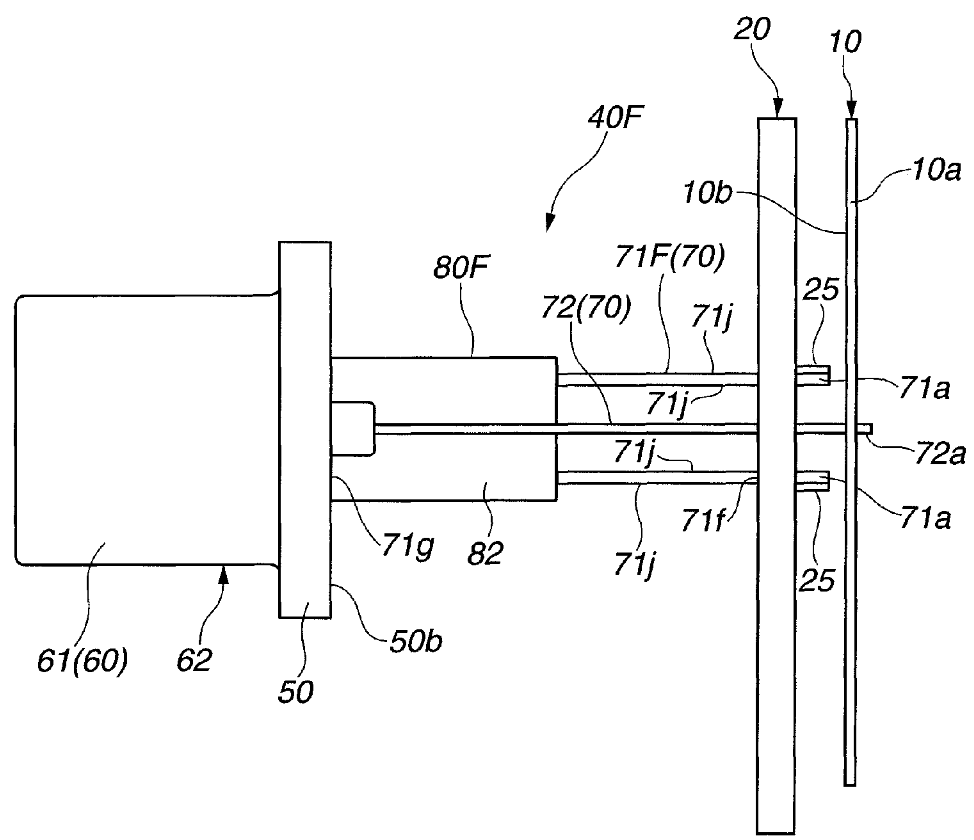
FIG. 22 is a bottom view of the connector according to the fifth embodiment of the present invention.
Figure 23:
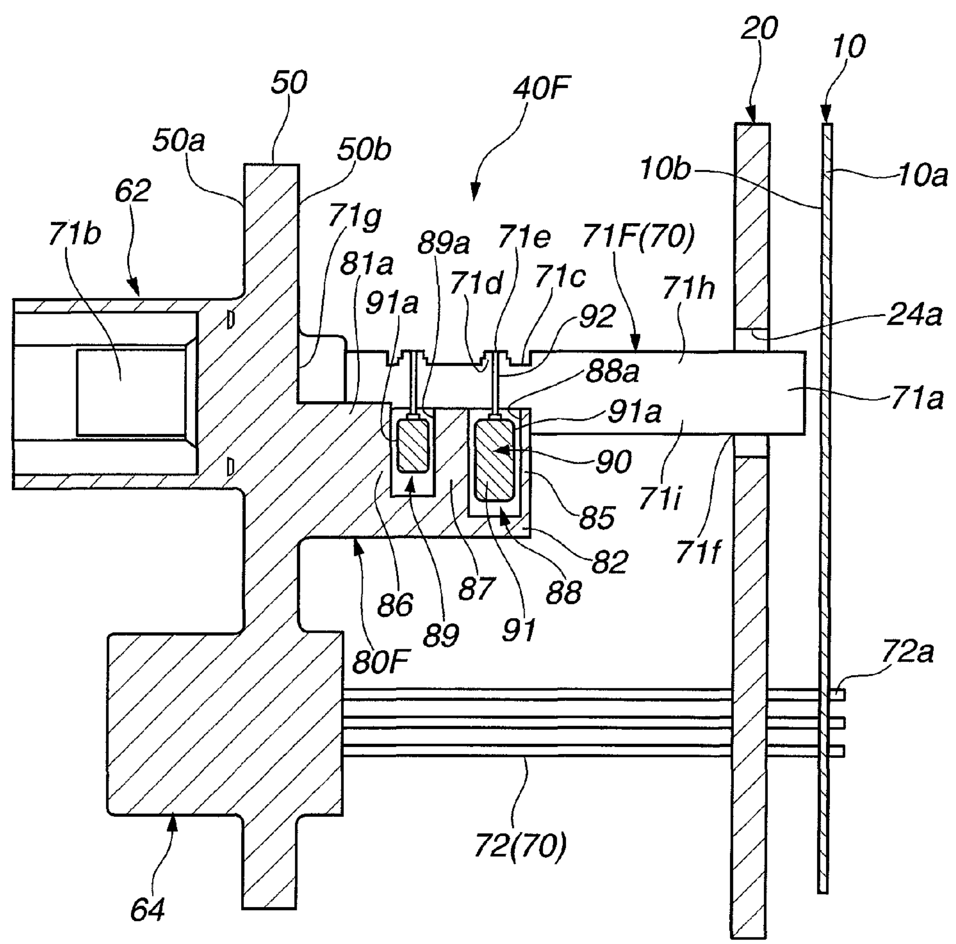
FIG. 23 is a cross sectional view of the connector according to the fifth embodiment of the present invention, taken along a line A-A of FIG. 19.

In the fifth embodiment, as shown in FIGS. 21 and 23, two condensers 90 having sizes different from each other are used. Each of these condensers 90 is attached to a pair of power connection terminals 71F. It is noted that each of the pair of power connection terminals 71F corresponds to the (plate-shape) connection terminal according to the present invention.

Each condenser 90 includes a body portion 91 and a pair of lead wires 92. The body portion 91 is formed in a substantially rectangular-parallelepiped shape. The pair of lead wires 92 extend from one end side of the body portion 91. By welding the pair of lead wires 92 respectively to the pair of power connection terminals 71F, the pair of power connection terminals 71F are electrically connected with each other through the condenser 90. As this welding method, a TIG welding, a spot welding, a solder welding, a laser welding, an electron beam welding, an ultrasonic welding and the like can be employed.

In this embodiment, one end portion (upper side in FIG. 20) 71*h* of each power connection terminal 71F relative to a width direction of the power connection terminal 71F is formed with a plurality of groove portions 71*c*. The plurality of groove portions 71*c* are formed by denting the one end portion 71*h* toward another end portion (lower side in FIG. 20) 71*i* of each power connection terminal 71F relative to the width direction, so that convex portions 71*d* are formed. That is, the plurality of groove portions 71*c* are formed in the one end portion 71*h* of each power connection terminal 71 relative to the width direction, so as to provide the convex portions 71*d* each protruding in one direction (upper direction of FIG. 20) of the width direction. Each convex portion 71*d* is formed with a groove portion 71*e* located in an approximately center portion of the convex portion 71*d* relative to the extension direction of power connection terminal 71F (the insertion direction of the connector 40F toward the case 30). This groove portion 71*e* is shallower than the groove portion 71*c*. A tip portion of each lead wire 92 is mounted in (attached into) the groove portion 71*e*, as shown in FIG. 23.

The two convex portions 71*d* are formed in a range from a connecting portion 71*f* between the busbar board 20 and the power connection terminal 71F to a fixing portion (base-portion side) 71*g* between the power connection terminal 71F and the base portion 50. The large and small two condensers 90 are attached respectively to the two convex portions 71*d*.

In this embodiment, the two convex portions 71*d* are formed at a location near the base portion 50 relative to the extension direction of power connection terminal 71F. That is, the location of the two convex portions 71*d* is closer to the fixing portion 71*g* than the connecting portion 71*f*.

A protecting portion 80F for protecting the condensers 90 is provided to at least one of the base portion 50 and the pair of power connection terminals 71F to which the condensers 90 are attached. In this example according to the fifth embodiment, the protecting portion 80F is provided on a side of the width-directional another end portions 71*i* of the pair of power connection terminals 71F. This protecting portion 80F extends from the inner surface 50*b* of base portion 50 toward the printed circuit board 10. The protecting portion 80F is formed integrally with the base portion 50 by insert molding.

In this embodiment, the protecting portion 80F is formed to straddle a region between the width-directional another end portion 71*i* of one of the pair of power connection terminals 71F and the width-directional another end portion 71*i* of another of the pair of power connection terminals 71F.

Specifically, the protecting portion 80F includes lateral walls 81 and 81 and a bottom wall 82. An upper end portion 81*a* of each lateral wall 81 covers or coats flat surface portions 71*j* of both sides (relative to the facing direction of the pair of power connection terminals 71F) of the width-directional another end portion 71*i* of power connection terminal 71F. Thereby, a predetermined clearance C is given between an upper end of the lateral wall 81 and a bottom of the groove portion 71*c*. Thus, by forming the clearance C between the upper end of lateral wall 81 and the bottom portion of groove portion 71*c*, it becomes easy to attach a welding electrode to the power connection terminal 71F when welding the lead wires 92 to the power connection terminals 71F. Accordingly, a workability of the welding is improved.

In this fifth embodiment, the protecting portion 80F includes a restriction wall portion for restricting the movement of each condenser 90.

Specifically, a front wall 85, a dividing wall 87 and a rear wall 86 are formed between the both lateral walls 81. That is, each of the front wall 85, the dividing wall 87 and the rear wall 86 is formed to connect the both lateral walls 81 integrally with each other. Relative to the extension direction of power connection terminal 71F, the front wall 85, the dividing wall 87 and the rear wall 86 are arranged in this order from the side of the tip portion 71*a* of power connection terminal 71F (from the side of busbar board 20). The both lateral walls 81, the front wall 85, the dividing wall 87 and the rear wall 86 define the restriction wall portion for restricting the movement of condensers 90.

A space portion 88 is formed in a front portion of the protecting portion 80F (i.e., in a protecting portion 80F's part closer to the tip portion 71*a* of power connection terminal 71F). That is, the space portion 88 is surrounded by the both lateral walls 81, the front wall 85, the dividing wall 87 and the bottom wall 82. The space portion 88 opens in a direction toward the one end portion 71*h* of power connection terminal 71F.

Moreover, a space portion 89 is formed in a rear portion of the protecting portion 80F (i.e., in a protecting portion 80F's part closer to the base portion 50). That is, the space portion 89 is surrounded by the both lateral walls 81, the dividing wall 87, the rear wall 86 and the bottom wall 82. The space portion 89 opens in the direction toward the one end portion 71*h* of power connection terminal 71F.

In this embodiment, the space portion 88 is formed (designed) to provide a slight clearance between an inner wall surface 88*a* of the space portion 88 and a lateral surface 91*a* of the body portion 91 of the large condenser 90 under a state where the body portions 91 of the small and large two condensers 90 have been accommodated in the space portions 88 and 89. In the same manner, the space portion 89 is formed (designed) to provide a slight clearance between an inner wall surface 89*a* of the space portion 89 and a lateral surface 91*a* of the body portion 91 of the small condenser 90 under the state where the body portions 91 of the small and large two condensers 90 have been accommodated in the space portions 88 and 89.

In this embodiment, under a state where the body portions 91 of the small and large two condensers 90 have been accommodated respectively within the space portions 88 and 89 and where the lead wires 92 have been welded respectively to the convex portions 71*d* of the pair of power connection terminals 71F, liquid resin (not shown) is injected into the space portions 88 and 89 (i.e., into the clearance between the inner wall surface 88*a* of space portion 88 and the lateral surface 91*a* of body portion 91 so and into the clearance between the inner wall surface 89*a* of space portion 89 and the lateral surface 91*a* of body portion 91). Thereby, the condensers 90 are fixed.

It is preferable that a silicon-series resin which has a relatively high elasticity also after its adhesion is used as the above-mentioned liquid resin. By fixing the condensers 90 by use of such a silicon-series resin, a deformation of the resin itself can be permitted (offset) at the time of heat shrinkage or the like, so that a stress which is applied to the body portion 91 of each condenser 90 or the fixed portion (welded portion) 92*a* of the lead wire 92 can be relieved. Accordingly, the adhered resin can be inhibited from becoming cracked. Moreover, the body portion 91 and the lead wires 92 of the condenser 90 can be inhibited from being broken or damaged. Furthermore, the fixed portion (welded portion) 92*a* of lead wire 92 can be inhibited from being damaged.

By filling the space portions 88 and 89 with the silicon-series resin to secure the condensers 90, the body portion 91 and lead wires 92 of each condenser 90 and the fixed portion (welded portion) 92*a* of each lead wire 92 can be protected more reliably.

In the case that the condensers 90 are fixed by use of the silicon-series resin having a relatively high elasticity, the silicon-series resin itself is deformed at the time of generation of vibration. By virtue of this deformation, the stress which is applied to each condenser 90 can be eased as mentioned above. However, if an amount of the silicon-series resin is large, an amount (degree) of the deformation of silicon-series resin itself is large, so that a relatively large stress caused due to the deformation of silicon-series resin itself is applied to the condensers 90. That is, in a case that a percentage (share) of the silicon-series resin in the space portion 88 or 89 is large, a relatively large stress is applied to the condenser 90 due to the deformation of silicon-series resin itself generated by vibration and like. Hence, in this case, the deformation of silicon-series resin itself generated by vibration greatly influences the condensers 90.

Therefore, as shown in FIG. 23, a part of the bottom wall 82 which defines the space portion 89 is made to be thicker than a part of the bottom wall 81 which defines the space portion 88. Thereby, a depth of the space portion 88 becomes deeper than the space portion 89. The large condenser 90 is received in the space portion 88. The small condenser 90 is received in the space portion 89 narrower than the space portion 88.

Thus, the separated accommodation space is given to every condenser 90, and the size of each separated accommodation space is set in dependence upon the size of the condenser 90. Accordingly, the percentage of the silicon-series resin inside the space portion 88 or 89 can be inhibited from becoming large. As a result, the condensers 90 attached to the power connection terminals 71F can be inhibited from receiving the influence of vibration.

The connector 40F having the above-mentioned structures is manufactured as follows.

At first, the three signal connection terminals 72 and the pair of power connection terminals 71F are disposed at predetermined locations inside the mold. At this time, the convex portions 71*d* and the groove portions 71*e* and 71*c* have been formed in the width-directional one end side of each power connection terminal 71F, in advance. Then, an insulating synthetic resin (for example, PBT (polybutylene terephthalate), PPS (polyphenylene sulfide) or PA (polyamide)) is inputted into the mold in which the signal connection terminals 72 and the power connection terminals 71F have been disposed. By consolidating the inputted synthetic resin; the power connection terminals 71F, the signal connection terminals 72 and the base portion 50 are formed by insert molding. At the same time, the wall portions 60 and the protecting portion 80F are formed by the insert molding.

Next, the body portion 91 of each condenser 90 is accommodated (disposed) inside the space portion 88 or 89 formed at the protecting portion 80F, while placing the two lead wires 92 of the condenser 90 respectively into the groove portions 71*e* of the pair of power connection terminals 71F.

Next, the respective lead wires 92 are welded to the power connection terminals 71F, so that the pair of power connection terminals 71F are electrically connected with each other through the condenser 90.

Finally, the liquid resin is inputted into the space portions 88 and 89 of the protecting portion 80F so that the respective condensers 90 are fixed. Thereby, the connector 40F is formed.

Therefore, the control unit (electronic apparatus) 1 of an electric power steering system in the fifth embodiment according to the present invention produces the following advantageous effects.

At first, in the fifth embodiment, each condenser 90 is attached to the pair of power connection terminals 71F so that the pair of power connection terminals 71F are electrically connected with each other through the condensers 90. Therefore, a space (a space sandwiched between the pair of power connection terminals 71F) which exists as a dead space in previous techniques in the art can be effectively used as an arrangement space for electronic components according to this embodiment. As a result, the connector 40F can be downsized. Thereby, the control unit 1 of electric power steering system can be further downsized.

Specifically, since the condenser 90 electrically connects the pair of power connection terminals 71F with each other, the number of the first electronic components (such as the condenser 21) which should be mounted in the printed circuit board 10 or the busbar board 20 can be reduced. That is, in this embodiment, the electronic components which are mounted in the printed circuit board 10 or the busbar board 20 as the first electronic components in the other techniques in the art are mounted as the second electronic components. Thereby, the number of the first electronic components which are mounted in the printed circuit board 10 or the busbar board 20 becomes small so that the printed circuit board 10 and the busbar board 20 can be further downsized in this embodiment.

In other words, in a case that the printed circuit so board 10 and the busbar board 20 which have sizes same as the other techniques are used, the number of whole electronic components (total number of the first and second electronic components) that can be mounted in the control unit 1 of electric power steering system can be increased according to this embodiment. That is, more electronic components can be mounted in the control unit (electronic apparatus) 1 of the electric power steering system, without upsizing the control unit 1.

In this embodiment, the convex portions 71*d* are formed at the with-directional one end portion 71*h* of each of the pair of power connection terminals 71F, and the condensers 90 are attached to the convex portions 71*d* by welding. Since the lead wires 92 of the condensers 90 are welded to the convex portions 71*d*, the welding can be performed with a low welding energy as compared with the case that the lead wires 92 are welded under a state where the lead wires 92 have been placed on a straightly-formed width-directional end portion of a power connection terminal. Accordingly, a power consumption can be reduced, and also, a time necessary for the welding can be shortened.

Moreover, since the welding is performed at the convex portions 71*d*, the melting amount of a welding material at the time of welding can be inhibited from varying among all the welding spots (among all the lead wires 92) as compared with the case that the lead wires 92 are welded under the state where the lead wires 92 have been placed on a straightly-formed width-directional end portion of power connection terminal. Furthermore, since the welding is performed at the convex portions 71*d*, a flow movement of the melted welding material can be suppressed. Thereby, a welding strength can be inhibited from varying among the respective welding spots (i.e., among all the welded portions 92*a*). Thus, by welding the convex portions 71*d*, it becomes easy to adjust the melting amount of the welding material at the time of welding. Accordingly, a workability of the welding can be improved.

Moreover, in this embodiment, the tip portion of each lead wire 92 is mounted into the groove portion 71*e*. Accordingly, a positioning of each condenser 90 relative to the pair of power connection terminals 71F is performed when placing the both lead wires 92 into the groove portions 71*e*. That is, the position of each condenser 90 can be inhibited from being shifted (moved) at the time of welding.

Moreover, in this embodiment, the convex portions 71*d* are located near the base portion 50 relative to the extension direction of the power connection terminals 71F. That is, the condensers 90 are attached to the power connection terminals 71F at a location which is near the base portion 50 and which is away from the printed circuit board 10 and the busbar board 20. Thus, by attaching the condensers 90 at the location away from the printed circuit board 10 and the busbar board 20, noises and static electricity which try to enter the case 30 from an external region can be blocked at an entrance side of the connector 40F. As a result, it can be suppressed that the noises or the static electricity derived from the external region are transmitted through an air existing between the base portion 50 and the circuit boards (the printed circuit board 10, the busbar board 20) to affect the printed circuit board 10 and the busbar board 20.

Moreover, in this embodiment, the protecting portion 80F for protecting the condensers 90 is provided to at least one of the base portion 50 and the pair of power connection terminals 71F. Thus, by providing the protecting portion 80F, a load produced due to vibration can be inhibited from being applied to the fixed portion (welded portion) 92*a* of each condenser 90. Accordingly, a faulty electrical continuity can be inhibited from occurring between the condenser 90 and the power connection terminal 71F.

Moreover, in this embodiment, the protecting portion 80F straddles the region between the width-directional another end portion 71*i* of one of the pair of power connection terminals 71F and the width-directional another end portion 71*i* of another of the pair of power connection terminals 71F. That is, tip portions of the both lateral walls 81 and 81 are respectively in contact with the width-directional another end portion 71*i* of one of the pair of power connection terminals 71F and the width-directional another end portion 71*i* of another of the pair of power connection terminals 71F. Hence, the protecting portion 80F is formed to surround the body portion 91 of each condenser 90. As a result, the vibration of power connection terminals 71F can be suppressed at the mounting region of condensers 90. The conduction between the condenser 90 and the power connection terminal 71F can be further inhibited from being blocked.

Moreover, the condensers 90 are attached to the flat-plate-shaped power connection terminals 71F each of which is welded to the busbar board 20. That is, the condensers 90 are attached to the power connection terminals 71F that is insusceptible to the influence of vibration. Hence, each condenser (the second electronic component) 90 can be inhibited from receiving the influence of vibration. As a result, a load can be inhibited from being applied to the fixed portion (welded portion) 92*a* due to a vibration of the condenser 90. Therefore, a faulty electrical continuity between the condenser 90 and the power connection terminal 71F can be suppressed.

Moreover, in this embodiment, by providing the restriction wall portion to the protecting portion 80F, the space portions 88 and 89 are formed in conformity with the sizes of respective condensers 90. Thereby, the movements of the respective condensers 90 received in the space portions 88 and 89 are restricted or limited by the inner wall surfaces 88*a* and 89*a* of space portions 88 and 89.

Since the restriction wall portion for restricting the movement of each condenser 90 is provided to the protecting portion 80F, the vibration influence to the fixed portion (welded portion) 92*a* of each condenser 90 can be suppressed. As a result, the control unit (electronic apparatus) 1 of electric power steering system is obtained which can suppress the faulty electrical continuity at the fixed portion (welded portion) 92*a* of each condenser 90.

In the technique of the above-mentioned Japanese Patent Application Publication No. 9-035820, a circuit pattern formed in the circuit board installed into the connector portion is connected to conductors of a coaxial cable. Hence, when the coaxial cable vibrates, there is a risk that this vibration influences a connecting spot between the circuit board and the conductors so that the connecting spot causes a faulty electrical continuity. Contrary to this, in this embodiment according to the present invention, such a risk can be removed.

Sixth Embodiment

A connector 40G according to a sixth embodiment will now be explained referring to FIGS. 24 and 25.

The connector 40G according to the sixth embodiment has a structure basically similar to the fifth embodiment. In the sixth embodiment, the connector 40G includes a plurality of connection terminals 70, and a base portion 50. The plurality of connection terminals 70 are electrically connected with the printed circuit board 10 and the busbar board 20. The base portion 50 holds the plurality of connection terminals 70 and is attached to the case 30.

Each condenser 90 is attached to a pair of power connection terminals 71F. Thereby, the pair of power connection terminals 71F are electrically connected with each other through the condensers 90.

A protection portion 80G for protecting the condensers 90 is provided to at least one of the base portion 50 and the pair of power connection terminals 71F.

The protecting portion 80G includes a restriction wall portion for restricting the movement of each condenser 90.

Specifically, a front wall 85, a dividing wall 87 and a rear wall 86 are formed between the both lateral walls 81. That is, each of the front wall 85, the dividing wall 87 and the rear wall 86 is formed to connect the both lateral walls 81 integrally with each other. Relative to the extension direction of power connection terminal 71F, the front wall 85, the dividing wall 87 and the rear wall 86 are arranged in this order from the side of tip portion 71*a* of the power connection terminal 71F (from the side of busbar board 20). The both lateral walls 81, the front wall 85, the dividing wall 87 and the rear wall 86 define the restriction wall portion for restricting the movement of condensers 90.

A space portion 88 is formed in a front portion of the protecting portion 80G (i.e., in a protecting portion 80G's part closer to the tip portion 71*a* of power connection terminal 71F), in the same manner as the fifth embodiment. That is, the space portion 88 is surrounded by the both lateral walls 81, the front wall 85, the dividing wall 87 and the bottom wall 82. The space portion 88 opens in a direction toward the one end portion 71*h* of power connection terminal 71F (i.e., in the width direction of power connection terminal 71F opposite to the signal connection terminal 72).

Moreover, a space portion 89 is formed in a rear portion of the protecting portion 80G (i.e., in a protecting portion 80G's part closer to the base portion 50). That is, the space portion 89 is surrounded by the both lateral walls 81, the dividing wall 87, the rear wall 86 and the bottom wall 82. The space portion 89 opens in the direction toward the one end portion 71*h* of power connection terminal 71F.

Figure 24:
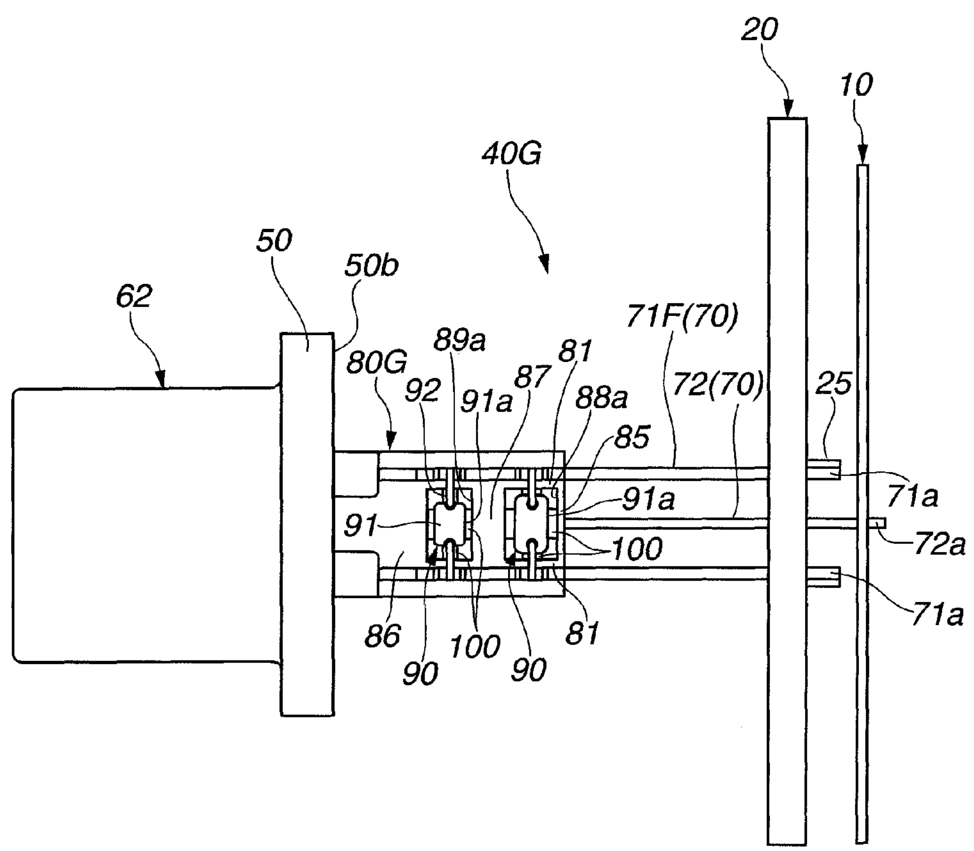
FIG. 24 is a top view of a connector according to a sixth embodiment of the present invention.
Figure 25:
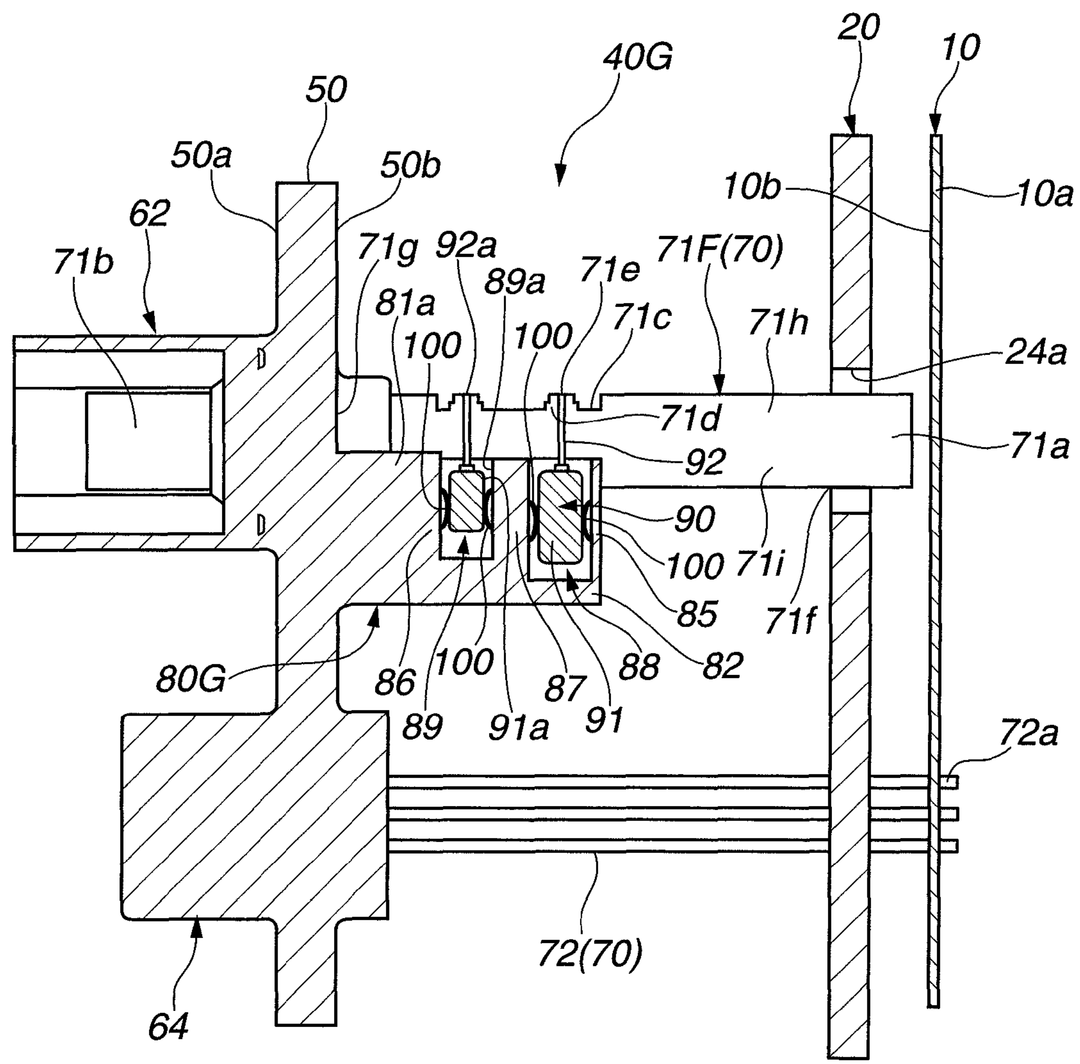
FIG. 25 is a cross sectional view of the connector according to the sixth embodiment of the present invention.

In this sixth embodiment, as shown in FIGS. 24 and 25, the restriction wall portion supports the condensers 90 through springs 100 (biasing members), as is mainly different from the above fifth embodiment.

Specifically, plate-shaped springs 100 are formed by the insert molding, so as to protrude from the four inner wall surfaces 88*a* (i.e., from four inner surfaces of the both lateral walls 81, the front wall 85 and the dividing wall 87) toward a center of the space portion 88. In the same manner, plate-shaped springs 100 are formed by the insert molding, so as to protrude from the four inner wall surfaces 89*a* (i.e., from four inner surfaces of the both lateral walls 81, the dividing wall 87 and the rear wall 86) toward a center of the space portion 89.

Then, when the body portion 91 of each condenser 90 is placed into the space portion 88 or 89, the both lateral surfaces 91*a* of body portion 91 which are opposed to each other in a longitudinal direction in cross section as shown in FIG. 24 are supported by the springs 100 to be sandwiched between the springs 100 in the longitudinal direction. At the same time, the both lateral surfaces 91*a* of body portion 91 which are opposed to each other in a direction perpendicular to the longitudinal direction in the cross section as shown in FIG. 24 are supported by the springs 100 to be sandwiched between the springs 100 in the direction perpendicular to the longitudinal direction.

That is, in this embodiment, the body portion 91 of each condenser 90 is inserted into the space portion 88 or 89 by press fitting, so that the condenser 90 is fixed.

In this example according to the sixth embodiment, the circumferential four lateral surfaces 91*a* of the body portion 91 are in contact with the springs 100 to be pressed by the springs 100. However, according to the sixth embodiment, only two lateral surfaces 91*a* opposed to each other (i.e., any one between the both lateral surfaces 91*a* opposed to each other in the longitudinal direction and the both lateral surfaces 91*a* opposed to each other in the direction perpendicular to the longitudinal direction) may be sandwiched and supported by the springs (biasing members) 100.

Also according to the sixth embodiment, operations and effects similar to the above fifth embodiment can be obtained.

Additionally, according to the sixth embodiment, since the restriction wall portion supports the condensers 90 through the spring (biasing member) 100, it is unnecessary to input liquid resin. Hence, the connector 40G can be manufactured easily.

Although the invention has been described above with reference to certain embodiments of the invention, the invention is not limited to the embodiments described above. Modifications and variations of the embodiments described above will occur to those skilled in the art in light of the above teachings.

For example, in the above respective embodiments, the control unit of electric power steering system has been exemplified as the electronic apparatus. However, the present invention is also applicable to various systems (for example, overall vehicle-control units such as a brake control unit) other than the electric power steering system. Furthermore, the present invention is applicable also to various systems other than the vehicle-control units.

Moreover, the convex portion of the first modified example in the first embodiment can be applied to the above second to sixth embodiments.

Moreover, the liquid resin is inputted into the space portion accommodating the second electronic component (condenser) in the fifth embodiment. However, according to the present invention, the second electronic component may be inserted into the space portion by means of static press fitting.

Moreover, the number of condensers (second electronic components) and the size of each condenser have been given as one example in each of the above embodiments. However, the present invention is not limited to these examples in number and size.

Moreover, the large and small two condensers (second electronic components) are attached to the connection terminals in the fifth and sixth embodiments. However, the number of condensers and the size of each condenser according to the present invention is not limited to this. Even in a case that one condenser or three or more condensers are attached to the connection terminals, the restriction wall portion can be provided to form a space portion(s) depending on the number of condensers. Also in this case, it is preferable that a size of each space portion is properly set depending on the size of the corresponding condenser.

Moreover, the condenser has been exemplified as the second electronic component in the above respective embodiments. However, the second electronic component (or simply, electronic component) according to the present invention is not limited to the condenser. The other electronic component such as a coil, a resistor, a relay and a diode can be used as the second electronic component according to the present invention. Alternatively, a plurality of kinds of electronic components can be used as the second electronic component according to the present invention. For example, an R-C circuit constructed by combining a condenser with a resistor can be used as the second electronic component according to the present invention. Also, a C-L circuit may be constructed by combining a condenser with a coil.

Moreover, according to the present invention, a sub-circuit formed by arranging electronic components on a small circuit board may be used as the second electronic component according to the present invention. In this case, the sub-circuit may remove noises or perform a signal processing before electric power and signals are supplied to the main circuit board.

Moreover, the second electronic component (condenser) is attached to the power connection terminals in the above respective embodiments. However, the present invention is not limited to this structure. That is, the second electronic component (such as condenser, resistor and . . . ) may be attached to the signal connection terminals. In this case, for example by attaching a resistor to the signal connection terminals, moderated (smoothed) signals can be corrected by the resistor.

This application is based on prior Japanese Patent Applications No. 2010-059502 filed on Mar. 16, 2010 and No. 2010-059513 filed on Mar. 16, 2010. The entire contents of these Japanese Patent Applications are hereby incorporated by reference.

The scope of the invention is defined with reference to the following claims.

What is claimed is:

1. An electronic apparatus comprising:
a case;
a circuit board mounted in the case; and
a connector,
wherein the connector includes
at least two connection terminals electrically connected with the circuit board, wherein an electronic component is attached to the at least two connection terminals to electrically connect the at least two connection terminals with each other through the electronic component, and
a base portion attached to the case, the base portion holding the at least two connection terminals,
wherein the electronic component is located between the base portion and the circuit board.

2. The electronic apparatus according to claim 1, wherein each of the at least two connection terminals is formed with a convex portion in a region ranging from the base portion to a connecting portion between the circuit board and the at least two connection terminals, and
the electronic component is attached to the convex portion.

3. The electronic apparatus according to claim 1, wherein the electronic component is more specifically at least one signal processing electronic component configured to electrically connect the at least two connection terminals with each other, to remove any noise entering via a connection terminal entrance from an environment external to the electronic apparatus, from affecting the circuit board.

4. An electronic apparatus comprising:
a case;
a circuit board mounted in the case; and
a connector,
wherein the connector includes
at least two connection terminals electrically connected with the circuit board, wherein an electronic component is attached to the at least two connection terminals to electrically connect the at least two connection terminals with each other through the electronic component, and
a base portion attached to the case, the base portion holding the at least two connection terminals,
wherein the connector further includes a protecting portion protecting the electronic component, and
the protecting portion is connected with at least one of the base portion and the at least two connection terminals.

5. The electronic apparatus according to claim 4, wherein the at least two connection terminals include a pair of plate-shaped connection terminals,
the electronic component is attached to one end portion of each of the pair of plate-shaped connection terminals relative to a width direction of the plate-shaped connection terminal, and
the protecting portion straddles a region between the one end portion of one of the pair of plate-shaped connection terminals and the one end portion of another of the pair of plate-shaped connection terminals.

6. The electronic apparatus according to claim 4, wherein the protecting portion includes a restriction wall portion configured to restrict a movement of the electronic component.

7. The electronic apparatus according to claim 6, wherein the restriction wall portion supports the electronic component through a biasing member.

* * * * *